US007506100B2

(12) United States Patent
Butler et al.

(10) Patent No.: US 7,506,100 B2
(45) Date of Patent: Mar. 17, 2009

(54) STATIC RANDOM ACCESS MEMORY (SRAM) COMPATIBLE, HIGH AVAILABILITY MEMORY ARRAY AND METHOD EMPLOYING SYNCHRONOUS DYNAMIC RANDOM ACCESS MEMORY (DRAM) IN CONJUNCTION WITH A DATA CACHE AND SEPARATE READ AND WRITE REGISTERS AND TAG BLOCKS

(75) Inventors: Douglas Blaine Butler, Colorado Springs, CO (US); Oscar Frederick Jones, Jr., Colorado Springs, CO (US); Michael C. Parris, Colorado Springs, CO (US); Kim C. Hardee, Colorado Springs, CO (US)

(73) Assignees: United Memories, Inc., Colorado Springs, CO (US); Sony Corporation, Tokyo (JP)

(*) Notice: Subject to any disclaimer, the term of this patent is extended or adjusted under 35 U.S.C. 154(b) by 405 days.

(21) Appl. No.: 11/064,354

(22) Filed: Feb. 23, 2005

(65) Prior Publication Data

US 2006/0190676 A1 Aug. 24, 2006

(51) Int. Cl.
*G06F 12/08* (2006.01)

(52) U.S. Cl. ....................................... 711/105; 711/162

(58) Field of Classification Search .................. 711/105
See application file for complete search history.

(56) References Cited

U.S. PATENT DOCUMENTS 5,295,109 A 3/1994 Nawaki
5,471,601 A 11/1995 Gonzales
5,566,318 A 10/1996 Joseph
5,659,515 A 8/1997 Matsuo et al.

(Continued)

FOREIGN PATENT DOCUMENTS

JP 10-260950 9/1998
WO WO 00/19445 A1 4/2000

OTHER PUBLICATIONS

Yoshioka, Shigemi, Nagatomo, Yoshiki, Takahashi, Shinya, Miyamoto, Sanpei, Uesugi, Masaru, 4Mb Pseudo/Virtually SRAM, IEEE International Solid-State Circuits Conference, ISSCC 87, Feb. 25, 1987, pp. 20-21, 320-322.

(Continued)

*Primary Examiner*—Hyung S Sough
*Assistant Examiner*—Hamdy S Ahmed
(74) *Attorney, Agent, or Firm*—William J. Kubida; Peter J. Meza; Hogan & Hartson LLP

(57) ABSTRACT

A high-speed, static random access memory (SRAM) compatible, high availability memory array and method employing synchronous dynamic random access memory (DRAM) in conjunction with a data cache and separate data read and write registers and tag blocks. The inclusion of separate data read and write registers allows the device to effectively operate at a cycle time limited only by the DRAM subarray cycle time. Further, the inclusion of two tag blocks allows one to be accessed with an externally supplied address and the other to be accessed with a write-back address, thus eliminating the requirement for a single tag to execute two read-modify write cycles in one DRAM cycle time.

19 Claims, 18 Drawing Sheets

U.S. PATENT DOCUMENTS

| | | | |
|---|---|---|---|
| 5,721,862 A | 2/1998 | Sartore et al. | |
| 5,829,026 A | 10/1998 | Leung et al. | |
| 5,835,442 A | 11/1998 | Joseph et al. | |
| 5,999,474 A | 12/1999 | Leung et al. | |
| 6,145,058 A | 11/2000 | Suganuma | |
| 6,201,733 B1 | 3/2001 | Hiraki et al. | |
| 6,205,065 B1 | 3/2001 | Sugibayashi | |
| 6,347,357 B1 * | 2/2002 | Sartore et al. | 711/105 |
| 6,378,047 B1 | 4/2002 | Meyer | |
| 6,445,636 B1 | 9/2002 | Keeth et al. | |
| 6,449,685 B1 | 9/2002 | Leung | |
| 6,466,484 B1 | 10/2002 | Sakakibara et al. | |
| 6,490,657 B1 | 12/2002 | Masubuchi et al. | |
| 6,604,174 B1 | 8/2003 | Dean et al. | |
| 6,625,077 B2 | 9/2003 | Chen | |
| 6,643,766 B1 | 11/2003 | Lesartre et al. | |
| 6,661,694 B2 | 12/2003 | Kund et al. | |
| 6,848,035 B2 | 1/2005 | Akiyama et al. | |
| 7,111,189 B1 * | 9/2006 | Sicola et al. | 714/6 |
| 2003/0033492 A1 | 2/2003 | Akiyama et al. | |
| 2003/0065884 A1 | 4/2003 | Lu et al. | |
| 2003/0067829 A1 | 4/2003 | Keeth et al. | |
| 2003/0200389 A1 | 10/2003 | Odenwald, Jr. | |
| 2004/0073745 A1 | 4/2004 | Ma et al. | |

OTHER PUBLICATIONS

Nogami, Kazutaka, Sakurai, Takayasu, Sawada, Kazuhiro, Wada, Tetsunori, Sato, Katsuhiko, Isobe, Mitsuo, Kakumu, Masakazu, Morita, Shigeru, Yokogawa, Shunji, Kinugawa, Masaaki, Asami, Tetsuya, Hashimoto, Kazuhiko, Matsunaga, Jun-Ichi, Nozawa, Hiroshi, Iizuka, Tetsuya, 1-Mbit Virtually Static RAM, IEEE Journal of Solid-State Circuits, vol. SC-21, No. 5, Oct. 1986, pp. 662-667.

* cited by examiner

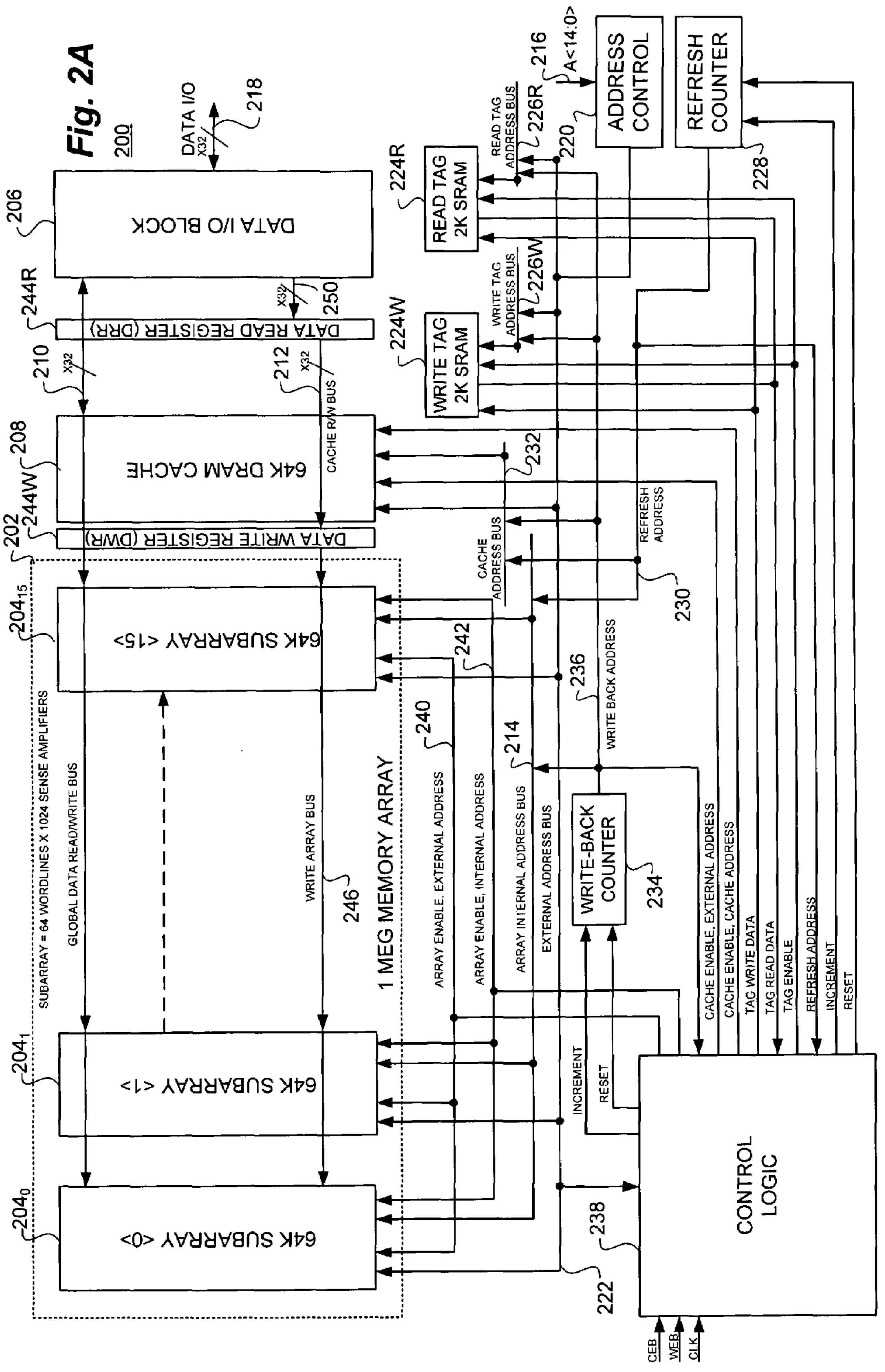
Fig. 2A
200
DATA I/O
X32
218
206
DATA I/O BLOCK
244R
DATA READ REGISTER (DRR)
X32
250
210
212
CACHE R/W BUS
208
64K DRAM CACHE
244W
DATA WRITE REGISTER (DWR)
202
204₁₅
64K SUBARRAY <15>
204₁
64K SUBARRAY <1>
204₀
64K SUBARRAY <0>
SUBARRAY = 64 WORDLINES X 1024 SENSE AMPLIFIERS
GLOBAL DATA READ/WRITE BUS
WRITE ARRAY BUS
246
1 MEG MEMORY ARRAY
ARRAY ENABLE, EXTERNAL ADDRESS
ARRAY ENABLE, INTERNAL ADDRESS
ARRAY INTERNAL ADDRESS BUS
EXTERNAL ADDRESS BUS
240
242
214
236
CACHE ADDRESS BUS
232
REFRESH ADDRESS
230
WRITE BACK ADDRESS
WRITE-BACK COUNTER
234
INCREMENT
RESET
CONTROL LOGIC
238
222
CEB
WEB
CLK
224R
READ TAG 2K SRAM
READ TAG ADDRESS BUS
226R
224W
WRITE TAG 2K SRAM
WRITE TAG ADDRESS BUS
226W
220
216
A<14:0>
ADDRESS CONTROL
REFRESH COUNTER
228
CACHE ENABLE, EXTERNAL ADDRESS
CACHE ENABLE, CACHE ADDRESS
TAG WRITE DATA
TAG READ DATA
TAG ENABLE
REFRESH ADDRESS
INCREMENT
RESET

900

1000

1100

TABLE 1

READ, REFRESH, NO CLEAR TAG

| | | | | |
|---|---|---|---|---|
| RSA HIT | CSA HIT | CIB ADR | | |
| YES | YES | DRRADR | | |
| YES | NO | WBADR | | |
| ALL OTHER COMBINATIONS | | REFADR | | |
| | | | | |
| RA<10>=1 | DWRH | RSA HIT | CSA HIT | AIB ADR |
| YES | | | | DWRADR |
| NO | NO | YES | NO | DWRADR |
| ALL OTHER COMBINATIONS | | | | REFADR |
| | | | | |
| DWRH | RSA HIT | CSA HIT | WFA ADR | |
| NO | YES | NO | WB ADR | |
| ALL OTHER COMBINATIONS | | | EA | |
| | | | | |
| | | | | CFA ADR |
| ALL COMBINATIONS | | | | EA |

*Fig. 12*

TABLE 2

WRITE, REFRESH, NO CLEAR TAG

| RSA HIT | CSA HIT | CIB ADR | AIB ADR | WFA ADR | CFA ADR |
|---|---|---|---|---|---|
| YES | NO | WBADR | DWRADR | WB ADR | EA |
| ALL OTHER COND | | REFADR | REFADR | EA | EA |

*Fig. 13*

TABLE 3

| TRUTH TABLE FOR THE INTERNAL DRAM ADDRESS BUSSES | | | | | |
|---|---|---|---|---|---|
| | | MSA HIT | MSA=RSA | RSA=CACHE | ADDRESS ON AIB |
| 1 | | X | 1 | 0 | REFADR |
| 2 | | 1 | X | 0 | REFADR |
| ALL OTHER COMBINATIONS | | | | | DWRADR |
| | | DRR HIT | MSA=RSA | RSA=CACHE | ADDRESS ON CIB |
| 4 | | 0 | 0 | 0 | WBPADR |
| 5 | | 0 | X(0) | 1 | REFADR |
| 6 | | X | 1 | X(0) | DRRADR |
| 7 | | 1 | X | X | DRRADR |
| 0=FALSE, 1=TRUE, X= DO NOT CARE | | | | | |
| X(1 or 0)=VALUE DETERMINATE FROM SPECIFIED PARAMETERS | | | | | |
| This logic is handled locally to the AIB and CIB muxes. | | | | | |
| EB always has External Address asserted. | | | | | |
| CIB is the Cache Internal Bus | | | | | |
| AIB is the Array Internal Bus | | | | | |

*Fig. 14*

TABLE 4

| ADDRESS TRUTH TABLE FOR THE WFA TAG ADDRESS BUS, WFAB | | | | |
|---|---|---|---|---|
| | CTF SET | MSA=RSA | WFABC SET | ADDRESS ON WFAB |
| 1 | 0 | 0 | 0 | WBPADR |
| 2 | 0 | 1 | 0 | MADR |
| 3 | 1 | X(1) | X(0) | WBPADR |
| 4 | X(0) | X(0) | 1 | EA - 1 |
| | | | | |
| P5 ADDRESS TRUTH TABLE FOR THE CFA TAG ADDRESS BUS, CFAB | | | | |
| | CTF SET | | | ADDRESS ON CFAB |
| 5 | 0 | | | EA |
| 6 | 1 | | | WBPADR |
| | | | | |
| | | | | |
| | | | | |
| | | | | |
| | | | | |
| | | | | |
| | | | | |
| | | | | |
| | | | | |
| | | | | |
| 0=FALSE, 1=TRUE, X = DO NOT CARE | | | | |
| X (*1 or 0*)=VALUE DETERMINATE FROM SPECIFIED PARAMETERS | | | | |
| | | | | |
| This logic is handled locally in the respective address muxes. | | | | |
| | | | | |
| EA - 1 is the External Address from the previous cycle. | | | | |

*Fig. 15*

TABLE 5

| WFA AND CFA CONTROL TRUTH TABLE | | | | | | | | | | | |
|---|---|---|---|---|---|---|---|---|---|---|---|
| CONDIITONS | | | | | | | | | CONTROLS | | |
| | WRITE | READ | RSA=CACHE | REFR SET | MSA HIT | MSA=RSA | WFABC SET | | WFAW | WFAD | ADDRES |
| 1 | 1 | X(0) | X(0) | 1 | 1 | 1 | X(0) | | 1 | 1 | MADR |
| 2 | 1 | X(0) | X(0) | 0 | 1 | 1 | X(0) | | 1 | 0 | MADR |
| 3 | X | X | X(0) | X | X | X(0) | 1 | | 1 | 0 | MADR-1 |
| WBA IS ASSERTED ON WFA BUS FOR ALL OTHER CONDITIONS | | | | | | | | | | | |
| 4 | DELETED | | | | | | | | | | |
| 5 | DELETED | | | | | | | | | | |
| 6 | DELETED | | | | | | | | | | |
| | WRITE | READ | RSA=CACHE | REFR SET | MSA HIT | MSA=RSA | | DRR HIT | CFAW | CFAD | |
| 7 | 1 | X(0) | X(0) | 1 | 1 | 1 | | X | 1 | 1 | |
| 8 | X(0) | 1 | X(0) | 1 | 1 | 1 | | X | 1 | 1 | |
| 9 | 1 | X(0) | X | 0 | 1 | X | | X | 1 | 0 | |
| 10 | 1 | X(0) | X | X | 1 | 0 | | X | 1 | 0 | |
| 11 | X(0) | 1 | 1 | 1 | 1 | X(0) | | 0 | 1 | 0 | |
| EA IS ASSERTED ON CFAB WHEN CTF=0, WBPADR IS ASSERTED ON CFAB WHEN CTF=1 | | | | | | | | | | | |
| WFAW and CFAW are asserted if and only if these conditions are met. | | | | | | | | | | | |
| 0=FALSE, 1=TRUE, X= DO NOT CARE | | | | | | | | | | | |
| X (1 or 0)=VALUE DETERMINATE FROM SPECIFIED PARAMETERS | | | | | | | | | | | |
| WFAW IS WFA WRITE ENABLE | | | | | | | | | | | |
| CFAW IS CFA WRITE ENABLE | | | | | | | | | | | |
| WFAD IS WFA WRITE DATA | | | | | | | | | | | |
| CFAD IS CFA WRITE DATA | | | | | | | | | | | |
| NOTE: When CTF is set both WFA and CFA are being cleared. This is done a full row of bits per cycle. | | | | | | | | | | | |

Fig. 16

TABLE 6

| TRUTH TABLE FOR AEBEN AND CEBEN | | | | | | | | | |
|---|---|---|---|---|---|---|---|---|---|
| | CTF | READ | WRITE | CFA HIT | REFR SET & MSA HIT & RSA HIT | DWR HIT | DRR HIT | AEBEN | CEBEN |
| 1 | 1 | 1 | X(0) | X | X | X(0) | X(0) | 1 | 0 |
| 2 | 1 | X(0) | 1 | X | X | X(0) | X(0) | 1 | 0 |
| 3 | 0 | 1 | X(0) | X(1) | X | X | 1 | 1 | 0 |
| 4 | 0 | 1 | X(0) | 0 | X | 0 | X | 1 | 0 |
| 5 | 0 | X(0) | 1 | X | 0 | X | X | 1 | 0 |
| 6 | 0 | 1 | X(0) | 1 | X | X | 0 | 0 | 1 |
| 7 | 0 | 1 | X(0) | 0 | X | 1 | X | 0 | 1 |
| 8 | 0 | X(0) | 1 | X | 1 | X | X | 0 | 1 |

AEBEN and CEBEN are asserted if and only if these conditions are met.

0=FALSE, 1=TRUE, X = DO NOT CARE

X (1 or 0)=VALUE DETERMINATE FROM SPECIFIED PARAMETERS

AEBEN is the ARRAY External Bus Enabale Signal

CEBEN is the CACHE External Bus Enabale Signal

*Fig. 17*

TABLE 7

TRUTH TABLE FOR AIBEN AND WAW AND RDWRL

| | CONDITIONS | | | | | | | | | | | | | CONTROLS | | | | |
|---|---|---|---|---|---|---|---|---|---|---|---|---|---|---|---|---|---|---|
| | CTF | READ | WRITE | MSA= RSA | RSA= CACHE | REFR | CFA HIT | RSA HIT | MSA HIT | DRR HIT | DWR HIT | WFABC | DWRL SET | AIBEN | WAW | RDWRL | ADDRESS ON AIB | |
| 1 | 0 | 0 | 0 | 1 | X(0) | 1 | X(0) | X(0) | X(0) | X(0) | X(0) | X(0) | X(0) | 1 | 0 | 0 | REFADR | |
| 2 | 0 | X(0) | 1 | X | 0 | 1 | X | 0 | 1 | X | X | X | X | 1 | 0 | 0 | REFADR | These two lines could be |
| 3 | 0 | X(0) | 1 | 1 | X(0) | 1 | X(0) | 0 | X(0) | X(0) | X(0) | X(0) | X(0) | 1 | 0 | 0 | REFADR | combined but are left |
| 4 | 0 | X(0) | 1 | 1 | X(0) | 1 | X | 1 | X(1) | X | X | X(0) | X(0) | 1 | 0 | 0 | REFADR | separate to better match |
| 5 | 0 | 1 | X(0) | X(0) | 0 | 1 | X | 0 | 1 | X | X | X | X | 1 | 0 | 0 | REFADR | the state diagram. |
| 6 | 0 | 1 | X(0) | 1 | 0 | 1 | X(0) | 0 | X(0) | X | X | X(0) | X(0) | 1 | 0 | 0 | REFADR | |
| 7 | 0 | 1 | X(0) | X(1) | X(0) | 1 | 1 | 1 | X(1) | 0 | X | X(0) | X(0) | 1 | 0 | 0 | REFADR | |
| 8 | 0 | 0 | 0 | 0 | 0 | X | X(0) | X(0) | X(0) | X(0) | X(0) | 0 | 1 | 1 | 1 | 1 | DWRADR | |
| 9 | 0 | X(0) | 1 | 0 | 0 | X | X(0) | X | 0 | X(0) | X(0) | 0 | 1 | 1 | 1 | 1 | DWRADR | |
| 10 | 0 | 1 | X(0) | 0 | 0 | X | X(0) | X | 0 | X(0) | X(0) | 0 | 1 | 1 | 1 | 1 | DWRADR | |
| 11 | 0 | 1 | X(0) | X(0) | 1 | X | 0 | X(0) | X | X | 1 | X | X(1) | 1 | 1 | 1 | DWRADR | |
| 12 | 0 | 1 | X(0) | X | 1 | 1 | 1 | X | 1 | 0 | X | X | 1 | 1 | 1 | 0 | DWRADR | |
| 13 | 0 | 1 | X(0) | X | 0 | 1 | 0 | X | X(1) | X | 1 | X | X(1) | 1 | 0 | 0 | REFADR | |
| 14 | 0 | X(0) | 0 | X | X | X | X | X | X(1) | X | 1 | X | X(1) | - | - | 1 | - | |

AIBEN, WAW, & RDWRL ARE ASSERTED IF AND ONLY IF THE ABOVE CONDITIONS ARE MET

LOGIC IN LINES 1 TO 7 IS ALSO USED IN REFRESH CONTROL. CHANGES HERE MUST BE REFLECTED THERE.

- = NOT DETERMINATE FROM THESE CONDITIONS
0=FALSE, 1=TRUE, X = DO NOT CARE
X (1 or 0)=VALUE DETERMINATE FROM SPECIFIED PARAMETERS

AIBEN is the ARRAY Internal Bus Enable Signal
WAW is the Write Array Bus Write Enable signal.
RDWRL is the Reset DWRL signal

Fig. 18

TABLE 8

| TRUTH TABLE FOR CIBEN, LDWR, CRWW & LDRR | | | | | | | | | | | | | | | | | | | | | |
|---|---|---|---|---|---|---|---|---|---|---|---|---|---|---|---|---|---|---|---|---|---|
| CONDITIONS | | | | | | | | | | | | | | | | | CONTROLS | | | | |
| | CTF | READ | WRITE | MSA= RSA | RSA= CACHE | REFR | CFA HIT | RSA HIT | MSA HIT | DRR HIT | DWR HIT | WFABC | DRRL | DWRL | WB<11> | WFA HIT | CIBEN | LDWR | CRWW | LDRR | ADDRESS ON CIB |
| 1 | 0 | 0 | 0 | X(0) | 1 | 1 | X(0) | X(0) | X(0) | X(0) | X(0) | X | X | X | X | X | 1 | 0 | 0 | 0 | REFADR |
| 2 | 0 | X(0) | 1 | X(0) | 1 | 1 | 0 | X(0) | X | 0 | 0 | X | X | X | X | X | 1 | 0 | 0 | 0 | REFADR |
| 3 | 0 | 1 | X(0) | X(0) | 1 | 1 | 0 | X(0) | X | 0 | 0 | X | X | X | X | X | 1 | 0 | 0 | 0 | REFADR |
| 4 | 0 | 0 | 0 | 0 | 0 | X | X(0) | X(0) | X(0) | X(0) | X(0) | 0 | X | 0 | 0 | 1 | 1 | 1 | 0 | 0 | WBPADR |
| 5 | 0 | X(0) | 1 | 0 | 0 | X | X | X | 0 | X(0) | X(0) | 0 | X | 0 | 0 | 1 | 1 | 1 | 0 | 0 | WBPADR |
| 6 | 0 | 1 | X(0) | 0 | 0 | X | X | X | 0 | X(0) | X(0) | 0 | X | 0 | 0 | 1 | 1 | 1 | 0 | 0 | WBPADR |
| 7 | 0 | 1 | X(0) | 1 | X(0) | 1 | 0 | 1 | X(1) | X | 0 | X | 1 | X | X | X | 1 | 0 | 1 | 1 | DRRADR |
| 8 | 0 | 1 | X(0) | X | X | X | X(1) | X | X(1) | 1 | X | X | X(1) | X | X | X | 1 | 0 | 1 | 0 | DRRADR |
| 9 | 0 | 1 | X(0) | 1 | X(0) | 1 | 0 | 1 | X(1) | X | 0 | X | 0 | X | X | X | 0 | 0 | 0 | 1 | DRRADR |
| 10 | 0 | 1 | X(0) | X(0) | 1 | 1 | 1 | X(0) | 1 | 0 | X | X | X | X | X | X | 0 | 1 | 0 | 0 | REFADR |

CIBEN, LDWR CRWW & LDRR ARE ASSERTED IF AND ONLY IF THE ABOVE CONDITIONS ARE MET

LOGIC IN LINES 1 TO 3 IS ALSO USED IN REFRESH CONTROL. CHANGES HERE MUST BE REFLECTED THERE.

0=FALSE, 1=TRUE, X = DO NOT CARE

X (1 or 0)=VALUE DETERMINATE FROM SPECIFIED PARAMETERS

AIBEN is the ARRAY Internal Bus Enable Signal

LDWR enables a Read on Cache R/W Bus. Data is transferred from CACHE to DWR. DWRL is set to 1.

CRWW enables a Write on CRW. Data is transferred from DRR to CACHE.

LDRR loads the DRR. Data is transferred from I/O BLK to DRR via the Global Data Read/Write Bus. DRRL is set to 1.

*Fig. 19*

TABLE 9

TRUTH TABLE FOR SCTF, RCTF, IWBA, RWBA, RDRRL

| | CONDITIONS | | | | | | | | | | | CONTROLS | | | | |
|---|---|---|---|---|---|---|---|---|---|---|---|---|---|---|---|---|
| | CTF | READ | WRITE | MSA= RSA | RSA= CACHE | MSA HIT | DRR HIT | WFABC | DWRL | WBA<11> | WBA<4> | SCTF | RCTF | IWBA | RWBA | RDRRL |
| 1 | 0 | 0 | 0 | 0 | 0 | X(0) | X(0) | 0 | 0 | 0 | X | 0 | 0 | 1 | 0 | 0 |
| 2 | 0 | X(0) | 1 | 0 | 0 | 0 | X | 0 | 0 | 0 | X | 0 | 0 | 1 | 0 | 0 |
| 3 | 0 | 1 | X(0) | 0 | 0 | 0 | X | 0 | 0 | 0 | X | 0 | 0 | 1 | 0 | 0 |
| 4 | 0 | 0 | 0 | 0 | 0 | X(0) | X(0) | 0 | 0 | 1 | X | 1 | 0 | 0 | 1 | 1 |
| 5 | 0 | X(0) | 1 | 0 | 0 | 0 | X | 0 | 0 | 1 | X | 1 | 0 | 0 | 1 | 1 |
| 6 | 0 | 1 | X(0) | 0 | 0 | 0 | X | 0 | 0 | 1 | X | 1 | 0 | 0 | 1 | 1 |
| 7 | 0 | X(0) | 1 | X | X | X | 1 | X | X | X | X | 0 | 0 | 0 | 0 | 1 |
| 8 | 0 | 1 | X(0) | X | X | X | 1 | X | X | X | X | 0 | 0 | 0 | 0 | 1 |
| 9 | 1 | X | X | X | X | X | X | X | X | X | 0 | 0 | 0 | 1 | 0 | 0 |
| 10 | 1 | X | X | X | X | X | X | X | X | X | 1 | 0 | 1 | 0 | 1 | 0 |

No signal is generated for setting CAP equal to SAP (CAP is set equal to SAP if CTF=1 and ZZ=0).

SCTF, RCTF, IWBA, RWBA, & RDRRL ARE ASSERTED IF AND ONLY IF THE ABOVE CONDITIONS ARE MET

SEE "P5 COMPARE AND CONTROL SIGNAL NAMES" FOR DEFINITIONS OF CONTROL SIGNALS

0=FALSE, 1=TRUE, X= DO NOT CARE
X(1 or 0)=VALUE DETERMINATE FROM SPECIFIED PARAMETERS

SCTF is Set Clear Tag Flag
RCTF is Reset Clear Tag Flag
IWBA is Increment Writeback Address
RWBA is Reset Writeback Address
RDRRL is Reset DRR Loaded flag

*Fig. 20*

TABLE 10

| TRUTH TABLE FOR WFABC | | | | | | | | |
|---|---|---|---|---|---|---|---|---|
| | COMMANDS | | | | | | CONTROLS | |
| | CTF | WRITE | MSA=RSA | CFA HIT | WFABC | | SWFABC | RWFABC |
| 1 | 0 | 1 | 0 | 1 | X | | 1 | 0 |
| 2 | 0 | 0 | X | X | 1 | | 0 | 1 |
| 3 | 0 | X | 1 | X | 1 | | 0 | 1 |
| 4 | 0 | X | X | 0 | 1 | | 0 | 1 |

Line 1: READ, REFR SET & MSA HIT are not included because they are determinate from WRITE, MSA=RSA & CFA HIT.

SWFABC and RWFABC are asserted if and only if these conditions are met.

0=FALSE, 1=TRUE, X = DO NOT CARE

X (1 or 0)=VALUE DETERMINATE FROM SPECIFIED PARAMETERS

WFABC is a flag indicating the WFA Bit at the External Address on this cycle must be Cleared on the next cycle.

SWFABC and RWFABC are Set and Reset WFABC signals respectively.

*Fig. 21*

STATIC RANDOM ACCESS MEMORY (SRAM) COMPATIBLE, HIGH AVAILABILITY MEMORY ARRAY AND METHOD EMPLOYING SYNCHRONOUS DYNAMIC RANDOM ACCESS MEMORY (DRAM) IN CONJUNCTION WITH A DATA CACHE AND SEPARATE READ AND WRITE REGISTERS AND TAG BLOCKS

CROSS REFERENCE TO RELATED PATENT APPLICATIONS

The present invention is related to the subject matter disclosed in U.S. patent application Ser No. 11/062,974 filed on Feb. 22, 2005 for: "Static Random Access Memory (SRAM) Compatible, High Availability Memory Array and Method Employing Synchronous Dynamic Random Access Memory (DRAM) in Conjunction with a Single DRAM Cache and Tag", assigned to the assignee of the present invention, the disclosure of which is herein specifically incorporated by this reference in its entirety.

COPYRIGHT NOTICE/PERMISSION

A portion of the disclosure of this patent document contains material which is subject to copyright protection. The copyright owner has no objection to the facsimile reproduction by anyone of the patent document of the patent disclosure as it appears in the United States Patent and Trademark Office patent file or records, but otherwise, reserves all copyright rights whatsoever. The following notice applies to the software and data and described below, inclusive of the drawing figures where applicable: Copyright © 2004 United Memories, Inc.

BACKGROUND OF THE INVENTION

The present invention relates, in general, to the field of integrated circuit memory devices and those devices incorporating embedded memory. More particularly, the present invention relates to a high-speed, static random access memory (SRAM) compatible, high availability memory array and method employing synchronous dynamic random access memory (DRAM) in conjunction with a data cache and separate read and write data registers and tag blocks, hereinafter sometimes referred to as a high-speed SCRAM (Static Compatible Random Access Memory).

SRAM is a type of memory technology which can maintain data without needing to be refreshed for as long as power is supplied to the circuit (i.e. "static"). This is, in contrast to DRAM which must be refreshed many times per second in order to maintain its data (i.e. "dynamic"). Among the main advantages of SRAM over DRAM is the fact that the former doesn't require refresh circuitry in order for it to maintain data, unlike the latter. For this and other reasons, the data access speed of SRAM is generally faster than that of DRAM. Nevertheless, SRAM is, on a byte-for-byte storage basis, more expensive to produce than DRAM due primarily to the fact that SRAMs take up much more on-chip area than DRAMs since SRAM is generally made up of four, six or even more transistors per memory cell. A DRAM cell, in contrast, generally comprises one transistor and one capacitor.

As mentioned previously, DRAM is constructed such that it only maintains data if it is fairly continuously accessed by refresh logic. Many times per second, this circuitry must effectively read the contents of each memory cell and restore each memory cell regardless of whether the memory cell is otherwise currently being accessed in a data read or write operation. The action of reading and restoring the contents of each cell serves to refresh the memory contents at that location.

Among the advantages of DRAMs are that their structure is very simple and each cell typically comprises but a single small capacitor and an associated pass transistor. The capacitor maintains an electrical charge such that, if a charge is present, then a logic level "1" is indicated. Conversely, if no charge is present, then a logic level "0" has been stored. The transistor, when enabled, serves to read the charge of the capacitor or enable writing of a bit of data to it. However, since these capacitors are made very small to provide maximum memory density and they can, under the best of circumstances, only hold a charge for a short period of time, they must be continually refreshed.

In essence, the refresh circuitry then serves to effectively read the contents of every cell in a DRAM array and refresh each one with a fresh "charge" before the charge leaks off and the data state is lost. In general, this "refreshing" is done by reading and restoring every "row" in the memory array whereby the process of reading and restoring the contents of each memory cell capacitor re-establishes the charge, and hence, the data state.

Consequently, it would be highly advantageous to provide a memory architecture which exhibited the memory density advantages of DRAM while nonetheless being able to provide memory access times approaching that of SRAM through the coordination of refresh operations (hidden refresh) so as not to impede normal memory read/write data access. In this regard, a number of ways of hiding DRAM refresh operation have heretofore been proposed for both synchronous DRAMs (SDRAMs; those memories in which operation of the memory is controlled by "valid" or "invalid" signals relative to the edges of a clock) and asynchronous DRAMs in which no clock synchronization is utilized.

Asynchronous Memory Refresh Hiding Techniques:

An article entitled "1-Mbit Virtually Static RAM", Nogami et.al., IEEE Journal of Solid-State Circuits, Vol. SC-21, No. 5, October 1986 pp. 662-667 describes a particular method for hiding refresh operations in an asynchronous DRAM, but as shown in Table IV at page 666m it is not completely compatible with (asynchronous) SRAMs. In addition a significant access time and cycle time penalty is incurred in its implementation.

A different article entitled: "4 Mb Pseudo/Virtually SRAM", Yoshioki, et.al., 1987 IEEE International Solid-State Circuits Conference, Digest of Technical Papers pp. 20-21 and 1987 ISSCC pp. 320-322 describes another method for hiding refresh that effectively increases the address access time from 60 nS to 95 nS, resulting in an unacceptably large performance penalty.

U.S. Pat. No. 6,625,077 issuing Sep. 23, 2003 to Chen for: "Asynchronous Hidden Refresh of Semiconductor Memory" describes a method for hiding refresh operations in an asynchronous DRAM by "stretching" all read or write cycles. The exact performance penalty incurred through implementation of the technique is not disclosed but would be significant.

Similarly, U.S. Pat. No. 6,445,636 issuing Sep. 3, 2003 to Keeth et al. for: "Method and System for Hiding Refreshes in a Dynamic Random Access Memory" describes a method for hiding DRAM refresh by doubling the number of memory cells, thus effectively doubling the area required. The method indicated incurs an unacceptably large cost penalty.

Synchronous Memory Refresh Hiding Techniques:

U.S. Pat. No. 5,999,474 issuing Dec. 7, 1999 to Leung et al. for "Method and Apparatus for Complete Hiding of the Refresh of a Semiconductor Memory" (hereinafter sometimes referred to as the "'474 patent") describes a method for hiding refresh in what appears to be an SDRAM (this is inferred by the CLK signal in FIG. 4) utilizing among other things a static RAM (SRAM) cache of the same size as one of the DRAM subarrays. Since, as previously noted, SRAM cells are much larger than DRAM cells, the physical size of the SRAM cache will be a significant penalty in implementing the method shown. U.S. Pat. No. 6,449,685 also to Leung issuing Sep. 10, 2002 for "Read/Write Buffers for Complete Hiding of the Refresh of a Semiconductor Memory and Method of Operating Same" (hereinafter sometimes referred to as the "'685 patent") addresses the issue of the size of an SRAM cache by replacing it with two DRAM caches of the same size. The two DRAM caches are somewhat misleadingly referred to as a write buffer and read buffer in FIG. 5, but each buffer has the same capacity as the SRAM cache shown in FIG. 1, so they are, in reality, caches.

In both the '474 and '685 patents, a cache may contain data from multiple subarrays at any one time. This imposes a size requirement on the tag SRAM memory that is equal to the number of words (a word being equal to the number of bits per address) in a subarray multiplied by (2+the number of bits required to uniquely address each subarray). A further fundamental limitation on the methods described is that the SRAM cache implements a write-back policy, such that all write data is initially written to the SRAM cache before being written to the memory banks, and all read data provided to the external data bus is stored in the SRAM cache. Since the data written to cache will be eventually written to the subarrays, the writes to cache consume power that would not be necessary for a DRAM not hiding refresh. Since the cache is expected to consume more power than a DRAM subarray per access, this write to cache before writing to a subarray is expected to more than double array power for writes. For random reads, 63 of 64 reads will be misses. Reading the subarray and writing to the cache is also expected to more than double the power 63 of 64 times. U.S. patent application Ser. No. 2003/0033492 to Akiyama et al. for: "Semiconductor Device with Multi-Bank DRAM and Cache Memory is very similar to that described in the '685 patent.

In general, the primary deficiencies of the known techniques for hiding refresh operations in asynchronous and synchronous DRAMs are that either an SRAM cache or two DRAM caches are required in addition to a tag capacity larger than might be desired. Disclosed in the aforementioned patent application incorporated by reference herein is a static random access memory (SRAM) compatible, high availability memory array and method employing synchronous dynamic random access memory (DRAM) which enables 100% memory system availability in a memory array comprising DRAM memory cells with only a single DRAM cache and a smaller tag than utilized in conventional techniques.

SUMMARY OF THE INVENTION

In addition to the disclosure of the aforementioned United States Patent Application incorporated by reference herein, the following structure and function is included:

Data Read Register (DRR)

The DRR maintains data that has been read from the memory array that is expected to be written into the cache in a subsequent cycle. If data is written to cache in the same cycle during which it is read from the memory array, the data is not available for the cache write quite as early in the cycle.

Data Write Register (DWR)

The DWR maintains data that has been read from the cache that is expected to be written into the memory array in a subsequent cycle. If data were to be written to the memory array in the same cycle during which it is read from the cache, the data would not be available for the memory array write quite as early in the cycle.

The inclusion of a data read register and a data write register allows the device to operate at a cycle time limited only by the DRAM subarray cycle time. However, some additional logic is required because the tag bit corresponding to data in the DRR or DWR are set or cleared in the cycle the data is written to the DRR or DWR since that is the cycle the tag is accessed at that address. As a result, the tag bit could possibly indicate data has been transferred to the cache when it is still in the DRR, but not yet in the cache. Consequently, flags indicating if the DRR or DWR contain data not as yet written to the cache or the memory array (DRRL and DWRL) and the corresponding addresses (DRRADR & DWRADR) have been added as well as the logic needed to track the state of the device.

Dual Write and Read Tags

The device disclosed herein implements the concept of the cache "mirroring" one and only one of the subarrays of the memory array. If the cache is "mirroring" a subarray, it may contain data that must be written back from the cache to that subarray. In order to know which data to transfer from the cache to the subarray, the tag bit for that data must be read. In every read or write cycle, the tag bit for the external address must also be read. If only one tag is used, the tag must be read at the external address as well as the write-back address in one cycle. The inclusion of two tags allows one of them to be accessed with the external address and the other to be accessed with the write-back address, thus eliminating the requirement for the tag to execute two read-modify write cycles in one DRAM cycle time. In the representative embodiment disclosed herein, the two tags have been implemented as a Cached Flag Array, CFA, and a Write Flag Array, WFA. The CFA indicates valid data in the cache and the WFA indicates data in cache that must be written back to the subarray. The set bits in the WFA are a subset of the set bits in the CFA.

Additional logic is also disclosed to assure the CFA and WFA are managed properly.

Early Address Multiplex Select

Before data can be read from a mirrored subarray, the CFA bit must be accessed to determine if the valid data is in the cache or the mirrored subarray. Operation of the device has been defined to allow all multiplexing of the addresses onto the appropriate busses based on information available at or before the rising edge of the clock (the information is available by approximately the setup time specified before the rising edge of the clock). Allowing the multiplexing of addresses onto the address busses in parallel with the CFA access therefore reduces the read access time of the device.

Active DRAM Subarray Limit

An access of a DRAM subarray can consume a significant amount of current and the current spike causes noise on the power supplies. The more DRAM subarrays that are accessed in one cycle, the more noise is potentially produced. The logic of the particular implementation of the present invention disclosed herein serves to limit DRAM subarray accesses on any given cycle to two. For these purposes, the cache may be considered a DRAM subarray because it is essentially identical to the subarrays in the 1 Meg array. The device logic disclosed, therefore, limits the accessed subarrays to two in a cycle, including the cache.

External Address Trapped For WFABC

In one of the embodiments of the present invention disclosed herein, the external address is trapped for a cycle and used to reset the WFA Bit associated with the external address.

Among the advantages inherent with the implementation of the present invention, is that the cycle time of the device is not limited by reading data from a subarray and writing that data to cache within one cycle time or by reading data from the cache and writing that data to a subarray within one cycle time. The cycle time is only limited by a read or write cycle time to the cache or a subarray. In addition, the tag memory is not required to execute a read to one address followed by a write to that address plus a read to a different address followed by a write to that address all in the device cycle time. (The write data in both cases are independent of the read data.) In operation, the tag memory need access only one address per device cycle time. Further, read access time is reduced by decoding and multiplexing the addresses in parallel with CFA and WFA accesses.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein:

FIGS. 2A and 2B are functional block diagrams of alternative embodiments of a memory in accordance with particular implementations of the present invention illustrating a high-speed, static random access memory (SRAM) compatible, high availability memory array employing synchronous dynamic random access memory (DRAM) in conjunction with a data cache and separate read and write data registers and tag blocks, hereinafter sometimes referred to as a high-speed SCRAM (Static Compatible Random Access Memory);

FIG. 12 is a table (Table 1) comprising a list of the addresses that are multiplexed onto each of the address busses for which multiplexing is required in the first embodiment of the present invention illustrated in FIG. 2A and corresponds to FIG. 7;

FIG. 13 is an additional table (Table 2) comprising a list of the addresses that are multiplexed onto each of the address busses for which multiplexing is required in the first embodiment of the present invention illustrated in FIG. 2A and corresponds to FIG. 8;

FIG. 14 is a truth table (Table 3) for the internal DRAM address busses with respect to the second embodiment of the present invention illustrated in FIG. 2B;

FIG. 15 is an address truth table (Table 4) for the Write Flag Array (WFA) Tag address bus, (WFAB) with respect to the second embodiment of the present invention illustrated in FIG. 2B;

FIG. 16 is a WFA and Cache Flag Array (CFA) control truth table (Table 5) with respect to the second embodiment of the present invention illustrated in FIG. 2B;

FIG. 17 is a truth table (Table 6) for the Array External Bus Enable (AEBEN) and Cache External Bus Enable (CEBEN) signals with respect to the second embodiment of the present invention illustrated in FIG. 2B;

FIG. 18 is a truth table (Table 7) for the Array Internal Bus Enable (AIBEN), Write Array Bus Write Enable (WAW) and Reset Data Write Register Loaded (RDWRL) signals with respect to the second embodiment of the present invention illustrated in FIG. 2B;

FIG. 19 is a truth table (Table 8) for the Cache Internal Bus Enable (CIBEN), Load Data Write Register (LDWR), Write on Cache Read/Write Bus (CRWW) and Load Data Read Register (LDRR) signals with respect to the second embodiment of the present invention illustrated in FIG. 2B;

FIG. 20 is a truth table (Table 9) for the Set Clear Tag Flag (SCTF), Reset Clear Tag Flag (RCTF), Increment Write-Back Address (IWBA), Reset Write-Back Address (RWBA) and Reset Data Read Register Loaded Data Flag RDRRL signals with respect to the second embodiment of the present invention illustrated in FIG. 2B; and FIG. 21 is a truth table (Table 10) for the Write Flag Address Bit Clear (WFABC) signal together with the Set WFABC and Reset WFABC control signals with respect to the second embodiment of the present invention illustrated in FIG. 2B.

DESCRIPTION OF A REPRESENTATIVE EMBODIMENT

Figure 1:
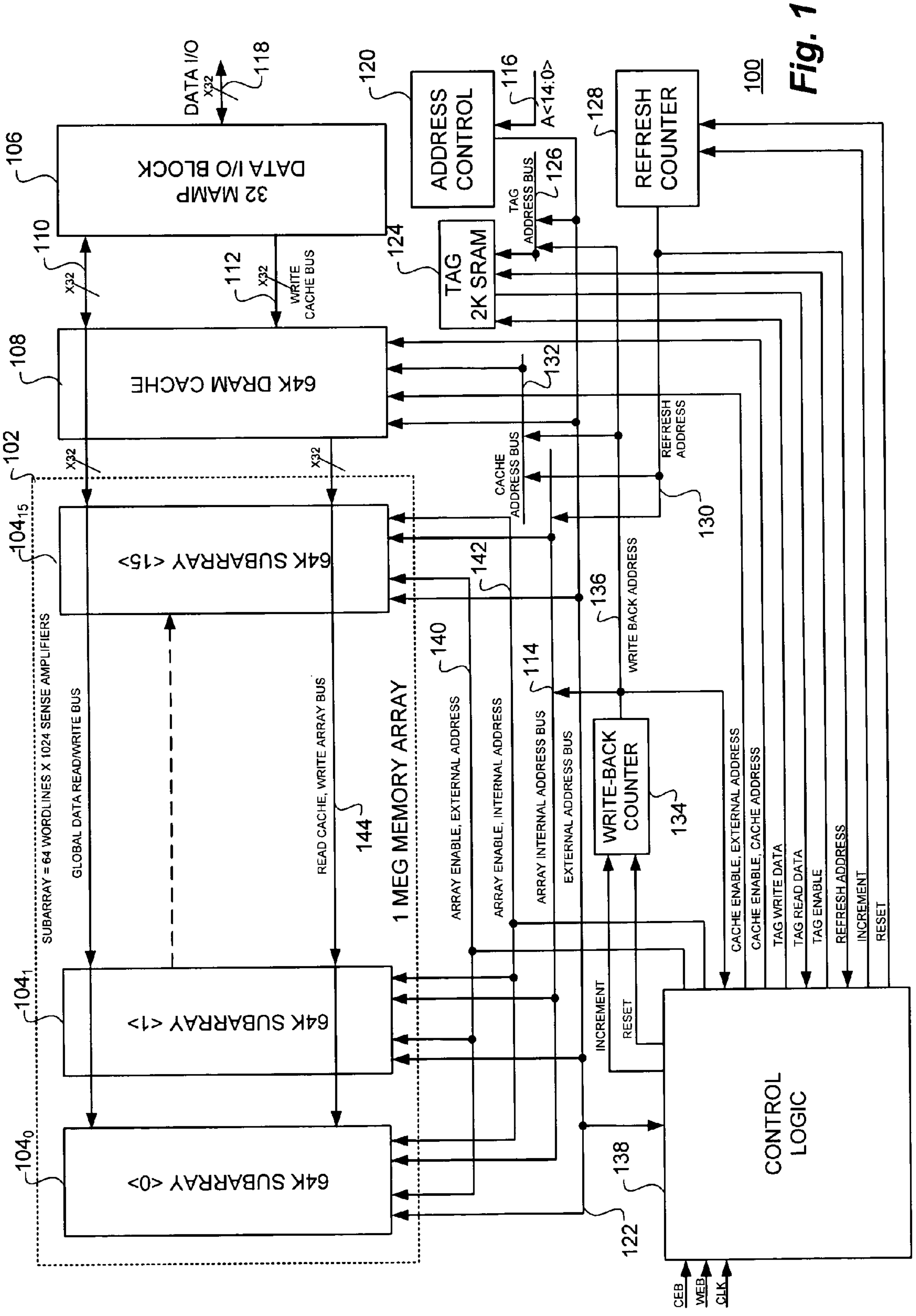
FIG. 1 is a functional block diagram of a memory in accordance with a particular implementation of the invention disclosed in the aforementioned patent application illustrating the data and address bussing thereof and wherein refresh of the subarrays and cache may be effectuated in parallel with any combination of external accesses and wherein control logic and control signals may be used to hide refresh operations in the memory array.

With reference now to FIG. 1, a functional block diagram of a memory 100 as disclosed in the aforementioned United States Patent is shown wherein refresh of the subarrays and cache may be effectuated in parallel with any combination of external accesses and control logic and control signals may be thereby used to hide refresh operations in the memory array.

The memory 100 comprises, in the representative implementation illustrated, a 1 Meg memory array 102 comprising sixteen 64K subarrays $104_0$ through $104_{15}$ (subarray <0> through subarray <15>). A data I/O block 106 is coupled to a 64K DRAM cache 108 as well as the subarrays $104_0$ through $104_{15}$ by a global data read/write bus 110. A read cache, write array bus 144 couples the DRAM cache 108 to the subarrays $104_0$ through $104_{15}$. Write cache bus 112 couples the data I/O block 106 and the DRAM cache 108. The DRAM cache 108 may be the same size as each of the subarrays $104_0$ through $104_{15}$.

An array internal address bus 114 is coupled to each of the subarrays $104_0$ through $104_{15}$ and addresses supplied to the memory array 100 are input on address bus 116 (A<14:0>) coupled to an address control block 120 while data read from, or input to, the memory array 100 is furnished on data I/O bus 118 coupled to the data I/O block 106. An external address bus 122 coupled to the address control block 120 is also coupled to each of the subarrays $104_0$ through $104_{15}$ as well as to 64K DRAM cache 108 and a tag address bus 126 which is coupled to a tag block 124 which, in the implementation shown, may comprise 2K of SRAM.

A refresh counter 128 is coupled to a refresh address bus 130 which is coupled to the array internal address bus 114 as well as to a cache internal address bus 132. The DRAM cache 108 is coupled to both the cache internal address bus 132 as well as the external address bus 122. A write-back counter. 134 is coupled to a write-back address bus 136 which is, in turn, coupled to the array internal address bus 114, the cache internal address bus 132 and the tag address bus 126.

In the particular, exemplary implementation of the present invention illustrated, the memory 100 further comprises a control logic block 138 which receives, as inputs a chip enable bar (CEB), write enable bar (WEB) and clock (CLK) signal inputs while providing “increment” and “reset” inputs to the write-back counter 134 and the refresh counter 128. The control logic block 138 is further coupled to the external address bus 122 as shown.

The control logic block 138 is also coupled to an array enable external address signal line 140 as well as an array enable internal address signal line 142 which is coupled to each of the subarrays $104_0$ through $104_{15}$. Output of the write-back counter 134 is also provided to the control logic block 138. A cache enable, external address and cache enable, cache address signals are provided to the DRAM cache 108 from the control logic block 138 which further provides a tag write data and tag enable signals to the tag 124. The tag 124 provides a tag read data signal to the control logic block 138 while the refresh counter 128 provides a refresh address signal as indicated.

Illustrated is a block diagram of a particular implementation of a 1 Mb SCRAM in the form of memory 100. The 1 Meg memory array 102 comprises sixteen subarrays 104. Each subarray 104 contains 64 wordlines and 1024 sense amplifiers for a 64K memory capacity. The DRAM cache 108 also contains 64 wordlines and 1024 sense amplifiers for a 64K memory capacity. Each subarray 104, therefore, contains 64K/32 or 2K 32 bit words of data. The data I/O block 106 can read from, or write to, any of the 16 subarrays 104 or the DRAM cache 108 via the global data read/write bus 110 which is 32 bits wide. Data enters and exits the SCRAM via the data I/O bus 118.

Addresses A<14:0> on address line 116 enter the SCRAM via the address control block 120. Four bits, (e.g. A<14:11>) are used to select one of the 16 subarrays 104, six bits, (e.g. A<10:5>) are used to select one of 64 wordlines within a subarray 104, and five bits, (e.g. A<4:0>) are used to select 32 of 1024 sense amplifiers along a wordline. The address control block 120 provides the ability to latch and/or pre-decode the addresses A<14:0> as needed.

In the particular implementation shown, the tag address bus 126 utilizes only A<10:0> of this address field as the subarray address the cache 108 is mirroring as contained in the mirrored subarray pointer. The tag address bus 126 also can be multiplexed to accept the write back address from the write-back counter 134. The write-back counter 134 generates an eleven bit write-back address and, therefore, counts from 0 to 2047 recursively. An ability to reset the write-back counter 134 from the control logic block 138 is also provided. The write-back address on bus 136 or the refresh address on bus 130 can be multiplexed onto the cache internal address bus 132. The cache 108 can be accessed using either cache enable, external address or cache enable, cache address signals from the control logic block 138.

A read/write data bus control, not shown, is handled by signals generated in the control logic block 138 and sent to the data I/O block 106, cache 108 and 1 Meg memory array 302. Each of the sixteen subarrays 104 can be enabled by either array enable, external address signal line 140 or array enable, internal address signal line 142. Both these signals are provided to all sixteen subarrays 104 and only the subarray 104 addressed by the enable for that address bus is activated.

In operation, the signal CEB goes “low” to indicate a read or write cycle while the signal WEB goes “low” to indicate a write cycle to the control logic block 138 if the CEB signal is also “low”. The control logic block 138 also contains a timer or counter to provide a REFRESH REQUEST signal.

Figure 2B:
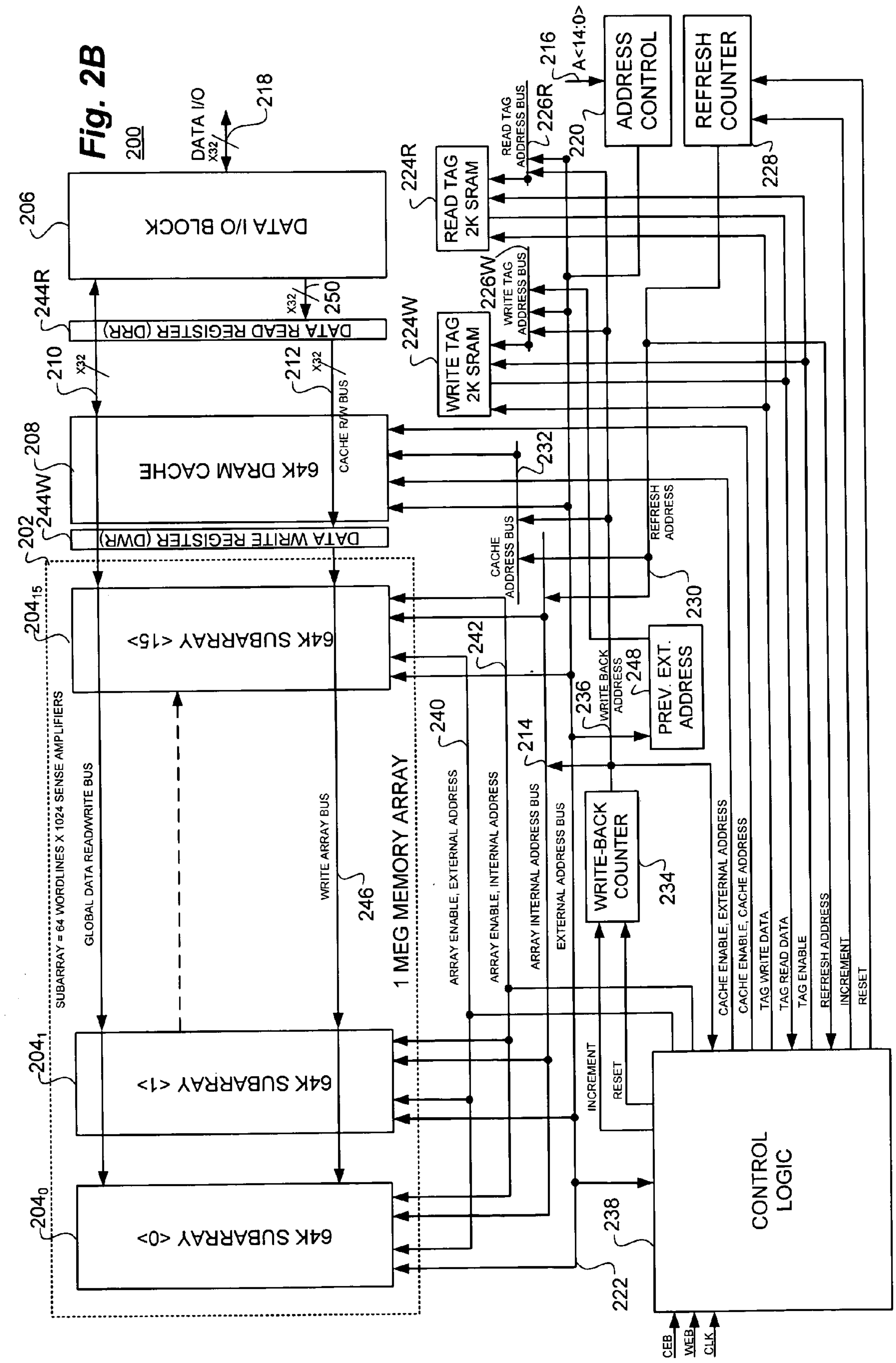

With reference additionally now to FIGS. 2A and 2B, functional block diagrams of a memory 200 in accordance with particular implementations of the present invention are shown illustrating a high-speed, static random access memory (SRAM) compatible, high availability memory array employing synchronous dynamic random access memory (DRAM) in conjunction with a data cache and separate read and write data registers and tag blocks.

The memory 200 comprises, in the representative implementations illustrated, a 1 Meg memory array 202 comprising sixteen 64K subarrays $204_0$ through $204_{15}$ (subarray <0> through subarray <15>). A data I/O block 206 is coupled to a 64K DRAM cache 208 as well as the subarrays $204_0$ through $204_{15}$ by a global data read/write bus 210. The data I/O block 206 is also coupled to a separate data read register (DRR) 244R. The data read register (DRR) 244R is coupled through a cache read/write bus 212 to the cache 208 and the data write register (DWR) 244W while a write array bus 246 couples the data write register 244W to the subarrays $204_0$ through $204_{15}$. As before, the DRAM cache 208 may be the same size as each of the subarrays $204_0$ through $204_{15}$.

An array internal address bus 214 is coupled to each of the subarrays $204_0$ through $204_{15}$ and addresses supplied to the memory 200 are input on address bus 216 (A<14:0>) coupled to an address control block 220 while data read from, or input to, the memory 200 is furnished on data I/O bus 218 coupled to the data I/O block 206. An external address bus 222 coupled to the address control block 220 is also coupled to each of the subarrays $204_0$ through $204_{15}$ as well as to a write tag address bus 226W and read tag address bus 226R which are coupled to respective tag blocks 224W and 224R which, in the implementation shown, may each comprise 2K of SRAM.

A refresh counter 228 is coupled to a refresh address bus 230 which is coupled to the array internal address bus 214 as well as to a cache internal address bus 232. The DRAM cache 208 is coupled to both the cache address bus 232 as well as the external address bus 222. A write-back counter 234 is coupled to a write-back address bus 236 which is, in turn, coupled to the array internal address bus 214, the cache internal address bus 232 and the write and read tag address busses 226W and 226R.

In the particular, exemplary implementations of the present invention illustrated, the memory 200 further comprises a control logic block 238 which receives, as inputs a chip enable bar (CEB), write enable bar (WEB) and clock (CLK) signal inputs while providing "increment" and "reset" inputs to the write-back counter 234 and the refresh counter 228. The control logic block 238 is further coupled to the external address bus 222 as shown.

The control logic block 238 also drives an array enable external address signal line 240 as well as an array enable internal address signal line 242 which is coupled to each of the subarrays $204_0$ through $204_{15}$. Output of the write-back counter 234 is also provided to the control logic block 238. A cache enable, external address and cache enable, cache address signals are provided to the DRAM cache 208 from the control logic block 238 which further provides a tag write data and tag enable signals to the write and read tags 224W and 224R respectively. The tags 224W and 224R provide tag read data signals to the control logic block 238 while the refresh counter 228 provides a refresh address signal as indicated.

In operation, CLK is the externally supplied clock signal. Control signals CEB (Chip Enable Bar) and WEB (Write Enable Bar) comprise inputs to the external memory 200 control pins. Write (e.g. CEB low, WEB low), Read (e.g. CEB low, WEB high) and NOOP (e.g. CEB high) are the three types of cycles defined by the control signals asserted at the CLK logic "low" to "high" transitions. A<14:0> are the address signals and address one of 32K 32 bit words. The 32 bit word is read from, or written to, the data I/O bus 218.

Data read or written via the data I/O bus 218 is written to or read from the 1 Meg memory array 202 or the cache 208 on the global data read/write bus 210. In addition, data read from the 1 Meg memory array via the global data read/write bus 210 can be transferred to the data read register 244R via the DRR Load bus. Data in the DRR 244R can be written to the cache via the cache read/write bus 212. Data transferred from the cache 208 to the global data read/write bus 210 during a "read" can also be transferred to the data write register 244W via the cache read/write bus 212 concurrently. Data in the DWR 244W can be written to the 1 Meg memory array 202 via the write array bus 246. Although not illustrated in detail, both the data read register 244R and the data write register 244W each comprise the requisite sensing and driving capabilities to effectuate the functions described above. A DRR load bus 250 couples the data I/O block 206 to the DRR 244R.

In the particular embodiments illustrated and described herein, two of the subarrays 204 may be accessed in a single clock cycle. However it is possible, based on the circuits disclosed, to access two subarrays 204 as well as the cache 208 in a single cycle. Since accessing two subarrays 204 and the cache 208 in a single cycle would result in increased on-chip noise, logic may be provided in the control logic block 238 to permit only one subarray 204 and the cache 208 or two subarrays 204 to be accessed in a clock cycle.

Two enable signals are provided for the 1 Meg memory array 202 and two for the cache 208. As the enable signal names indicate, each enable signal is associated with a specific address bus. A subarray 204 in the 1 Meg memory array will go "active" if the address for that subarray is asserted on a bus and the enable signal for that bus goes "high". The cache address bus 232 has no subarray 204 address information and the cache 208 does not use the subarray 204 address information on the external address bus 222. Therefore, the cache 208 is accessed whenever either of the cache enable signals goes "high".

The array enable, external address signal from the control logic bloc 238 is enabled during external "read" or "write" cycles that access the 1 Meg memory array 202. The cache enable, external address signal from the control logic block 238 is enabled during external "read" or "write" cycles that access the cache 208. Refresh to a subarray 204 is effectuated by taking the array enable, internal address signal "high" with the refresh address multiplexed onto the array internal address bus 214.

Write-Back from the data write register 244W to a subarray 204 is accomplished by taking the array enable, internal address signal 242 "high" with the DWR address (DWRADR) multiplexed onto the array internal address bus 214. Refresh to the cache 208 is undertaken by taking the cache enable, cache address signal from the control logic block 238 "high" with the refresh address (REFADR) information multiplexed onto the cache address bus 232. A write to the cache 208 from the data read register 244R is done by taking the cache enable, cache address signal "high" with the data read register 244R address (DRRADR) also multiplexed onto the cache address bus 232.

Data can be read from the cache 208 and transferred to the data write register 244W by one of two methods. During write-back cycles, the cache enable, cache address signal is taken "high" with the write-back address multiplexed onto the cache address bus 232 causing data from the cache 208 to be transferred to the data write register 244W. During an external read cycle that accesses the data in the cache 208, the cache enable, external address signal is taken "high" and cache data is put on both the global data read/write bus 210 and the cache read/write bus 212 causing the data in the Cache 208 to be both read and transferred to the data write register 244W.

In any clock cycle a "read" or "write" may require an access to the cache 208 or any subarray 204. All accesses to the cache 208 and subarrays 204 are, therefore, synchronous with the clock and are essentially identically timed relative to the clock. Data read from a subarray 204 is not written directly to cache 208 because the data is not available early enough in the clock cycle. The data from the subarray 204 can be written to the data read register 244R even after the cache 208 enters precharge since the data is intended to be written from the data read register 244R to the cache 208 in a subsequent clock cycle. Data read from the cache 208 to be written to a subarray 204 via the cache read/write bus 212 and the write array bus 246 is not written directly to a subarray 204 because the data is not available early enough in the clock cycle. The data from the cache 208 can be written to the data write register 244W even after the subarray 204 enters precharge since the data is intended to be written from the data write register 244W to the subarray 204 in a subsequent clock cycle. The data read register 244R and data write register 244W allow for a faster memory 200 cycle time over that of the memory array 100 of the preceding figure, since the cycle time does not have to be extended to account for the late arriving write data as described above.

The write tag 224W and read tag 224R contain one bit corresponding to each word of one subarray 204 of the 1 Meg memory array 202. A mirrored subarray pointer in the control logic block 238 indicates which subarray 204 the cache 208 is mirroring. Both the write and read tag bits are set on a write cycle during which data is written to the cache 208 via the global data read/write bus 210. Only the read tag 224R bit is set on a cycle data is written to the data read register 244R via the data I/O block 206.

Before the cache 208 can begin mirroring a different subarray 204, all the cache 208 data with a write tag 224W bit set must be written from the cache 208 to the subarray 204 and the read tag 224R must be cleared. The data from cache 208 is written back to the subarray 204 during write-back cycles.

The embodiment of the memory array 200 illustrated in FIG. 2B differs from that of the embodiment of FIG. 2A by the addition of a previous external address register 248. The previous external address register 248 is coupled to the external address bus 222 and stores and provides information regarding the previous cycle's external address from the external address bus 222 to the write tag address bus 226W as shown. As such, the control logic for the embodiments of FIGS. 2A and 2B will also differ somewhat.

The logical difference between the memory 200 implementations shown in FIG. 2A and FIG. 2B is the conditions under which a write-back cycle is initiated. For the embodiment of FIG. 2A, a write-back cycle is executed by the control logic 238 if there is a refresh requested and there is a read or a write to the subarray 204 to be refreshed and the cache 208 is not mirroring the subarray 204 to be refreshed. For the implementation of FIG. 2B, a write-back cycle is executed by the control logic 238 if the cache 208 is not mirroring the subarray 204 to be refreshed, the subarray 204 the cache 208 is mirroring is not being accessed and the cache 208 is not being accessed.

The execution of a write-back cycle for the implementation of FIG. 2B can result in data being written to the mirrored subarray 204 at the external address in a cycle for which the WFA is accessing an address different than the external address. This necessitates the WFABC flag being set and the WFA must then be cleared at the external address on the next cycle thus requiring the previous external address block 248 shown in FIG. 2B.

The logical constraints imposed on the implementation of FIG. 2A preclude the possibility of data being written to the mirrored subarray 204 at the external address in a cycle for which the WFA is accessing an address different than the external address. Therefore, no previous external address block 248 is required for the implementation of FIG. 2A. However, a possible access time penalty could occur with the implementation of FIG. 2A as a result of a difference in what WFA addresses are multiplexed onto the WFA bus for a given state of the memory 200. The information necessary to define the WFA address multiplexing is available from the previous cycle for the implementation of FIG. 2B while the information necessary to define the WFA address multiplexing for the implementation of FIG. 2A is only available at the setup time of the current cycle. Consequently, the implementation of FIG. 2A may exhibit a slight access time and cycle time penalty relative to the implementation of FIG. 2B.

During a write-back cycle the write-back address supplied by the write-back counter 234 is multiplexed onto the write tag address bus 226W while the external address is multiplexed onto the read tag address bus 226R. Having two tags 224W and 224R allows the read tag 224R to be accessed at the external address to determine if data needs to be read from the subarray 204 or the cache 208 and, at the same time, access the write tag 224W at a write-back address to determine if data in the cache needs to be written to the data write register 244W. Were a single tag to be used, data from two tag cycles would be required in a single memory 200 cycle. By using two tags 224W and 224R only one tag cycle is required per memory 200 cycle. Therefore, in the case where two tag cycles are longer than a single DRAM array cycle, the memory 200 cycle time is improved by the use of two tags 224W, 224R. In addition, since the write tag 224W is accessed in parallel with the read tag 224R, the cache 208 access can be done only if the write tag 224W bit is set. With a single tag, the second address tag data would be available later so the cache 208 would need to be accessed before the tag data from the write-back address is available. Therefore, the two tag 224W, 224R approach saves power.

With reference additionally to FIGS. 3 through 10 inclusive, representative partial state diagrams for the representative embodiment of a memory 200 illustrated in FIG. 2A in particular are shown. All decisions steps (indicated by diamonds) are accomplished in parallel early in a clock cycle before any actions are allowed to change the state of the memory 200 and no time sequence is implied in the relative positions of the decisions. All action steps (indicated by rectangles) reached as a result of the state of the memory 200 are executed after all decisions are made in that clock cycle but before any decisions are made in the next clock cycle.

During each CLK cycle conditions are evaluated to determine which actions will be executed during that clock cycle. State conditions, as indicated in the following listing, are all evaluated before any actions of that cycle are allowed to change any conditions. Actions of a current cycle are all completed, and the new conditions established, before conditions are evaluated for the following cycle. CFA and WFA (the SRAM write and read tags 224W and 224R) accesses are initiated on the rising edge of the CLK signal. Memory array 202 and cache 208 accesses are initiated after tag 224W and 224R data is valid.

MSA—Mirrored Subarray, address of subarray 204 the cache 208 is mirroring;

MSA HIT—read or write access is to MSA;

NEXT RSA EQUALS MSA—MSA is equal to the value RSA will increment to next;

CFA—Cache Flag Array, each bit 1=valid data, 0=invalid data, if 1 then data in array assumed invalid;

CFA HIT—CFA Hit, read or write access is to a location for which valid data is stored in the cache;

CTF—Clear Tag Flag, set to "1" to indicate all tag data to be cleared to 0. IF CTF=1 no refresh occurs;

DRR—Data Read Register, data is loaded into DRR 244R from array (via output buffer) and is written from DRR into cache 208;

DRRADR—Address to which DRR data is to be written;

DRR HIT—read or write access is to the address associated with the DRR (DRRADR) and DRRL=1;

DRRL—DRR Loaded Flag, when set indicates valid data in DRR not yet written to cache 208;

DWR—Data Write Register, data is loaded into DWR 244W from cache 208 and written from DWR to the MSA;

DWRADR—Address to which DWR data is to be written;

DWR HIT—read or write access is to the address associated with the DWR 244W (DWRADR) and DWRL=1;

DWRL—DWR Loaded Flag, when set indicates valid data in DWR 244W not yet written to MSA;

REFR—Refresh Request, generated by the refresh counter 228;

REFADR—Address to be refreshed;

RSA—Refresh subarray, subarray 204 to be refreshed. Can be one of the subarrays or the cache 208;

RSA HIT—read or write access is to RSA subarray address. If RSA is the cache, a HIT cannot occur;

WFA—Write-Back Flag Array (a "1" indicates data in cache 208 must be written back to the memory array 202);

WFA HIT—WFA has a "1" at the addressed bit indicating that the cache 208 has data at that location that must be written to the MSA; and WBA—Write-Back Address (used for CFA, WFA and cache addresses).

Figure 3:
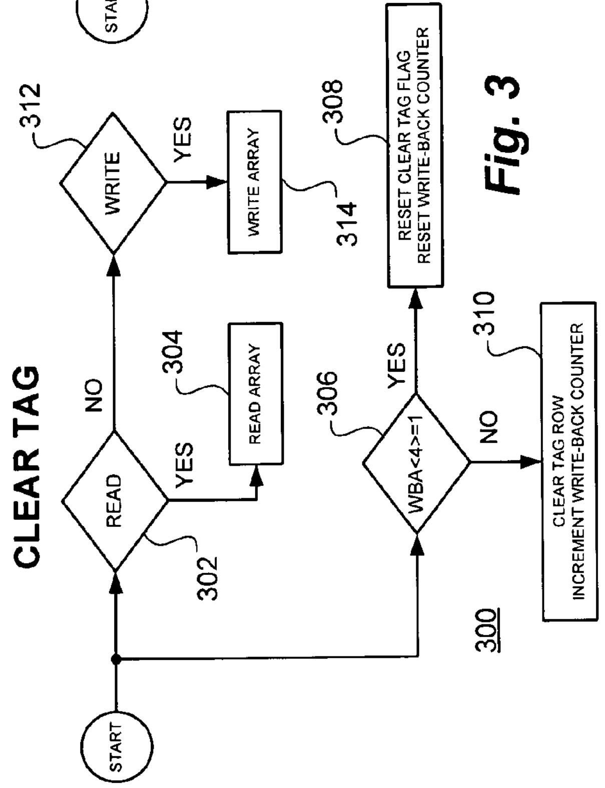
FIG. 3 is a representative partial state diagram for a particular implementation of a Clear Tag Cycle operation in accordance with an embodiment of the present invention as illustrated in FIG. 2A.

With reference specifically to FIG. 3, a representative partial state diagram for a particular implementation of a Clear Tag Cycle operation 300 in accordance with the present invention is shown. The operation 300, at decision step 302, determines if a read operation is in progress. At decision step 306, if WBA<4>=1, then the Clear Tag Flag is reset together with the write-back counter 234. If not, then at step 310, the tag row is cleared and the write-back counter 234 is incremented. At decision step 302, if the operation is not a read, then at decision step 312, if the operation is a write, the array is written at step 314.

Figure 9:
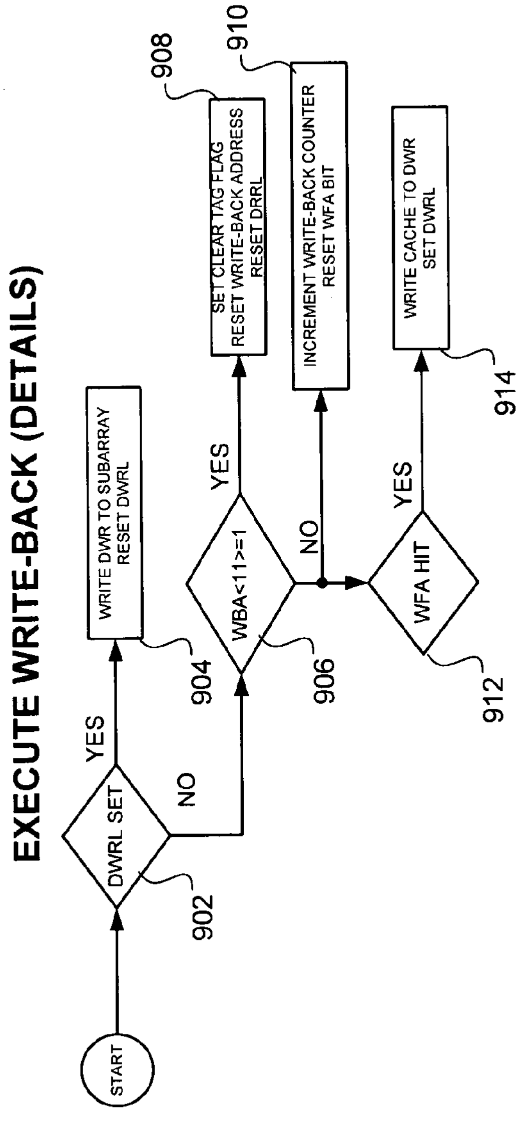
FIG. 9 is a further representative partial state diagram for the particular implementation of the present invention illustrated in FIG. 2A indicative of an Execute Write-Back operation as called in FIGS. 7 and 8.

In general, the Clear Tag Flag indicates a Clear Tag Cycle is to be executed and is called as illustrated in succeeding FIG. 9. The tags 224W and 224R are cleared only after all cache 208 data has been written to the mirrored subarray 204 and all data in the 1 Meg memory array 202 is valid. Any "read" or "write" is to the array 202 when the Clear Tag Flag is set. No refresh is executed when the Clear Tag Flag is set.

In a Clear Tag Cycle, the write-back address is multiplexed onto both the write tag address bus 226W and the read tag address bus 226R. The write-back counter 234 is reset in the cycle that the Clear Tag Flag is set (see, for example, FIG. 9). The write-back address increments the least significant bit (LSB) fast on each clock cycle from WBA<00000> to WBA<10000>, resetting all bits along the corresponding wordline in both the write and read tags 224W, 224R. The tags, in the representative embodiment illustrated, have only sixteen wordlines so all wordlines have been addressed by WBA<01111>. At WBA<10000>, all bits have been reset so the Clear Tag Flag is reset and the write-back counter 234 is reset.

Figure 4:
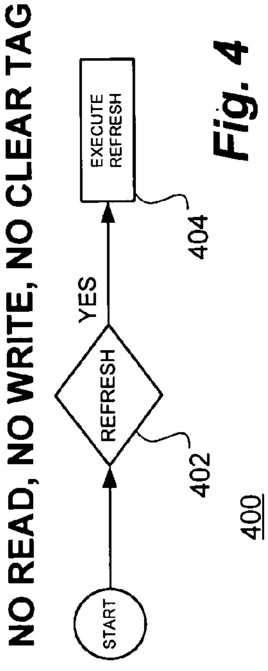
FIG. 4 is a further representative partial state diagram for the particular implementation of the present invention illustrated in FIG. 2A wherein a Refresh Request is asserted during a cycle that is neither a Read, Write or Clear Tag Cycle.

With reference specifically to FIG. 4, a further representative partial state diagram for a particular implementation of the present invention is shown wherein a Refresh Request is asserted during a cycle that is neither a Read, Write or Clear Tag Cycle in operation 400. The operation 400 simply determines, at decision step 402, if the operation is a refresh, and if so, then the refresh is executed at step 404.

Basically, if a Refresh Request is asserted during a cycle that is not a read or a write or a Clear Tag Cycle, a refresh is executed. Refresh operations will be more fully described hereinafter with respect to the succeeding FIG. 10.

Figure 5:
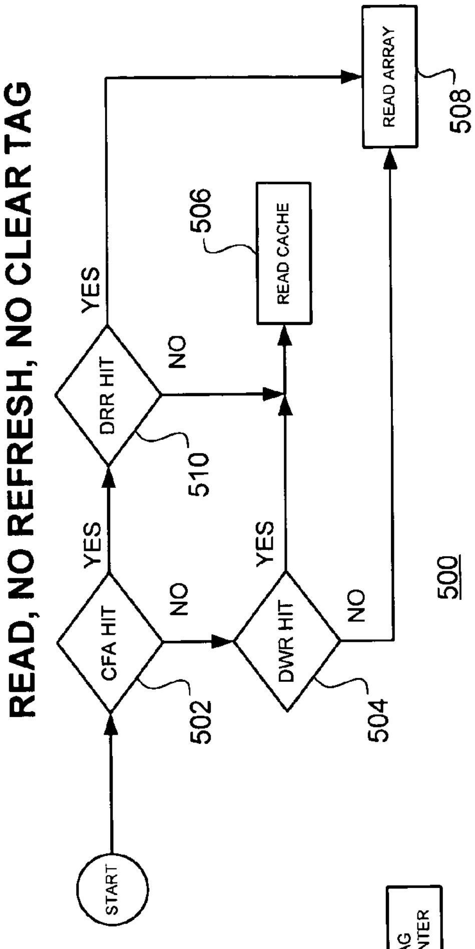
FIG. 5 is a further representative partial state diagram for the particular implementation of the present invention illustrated in FIG. 2A under the condition of a Read, No Refresh and No Clear Tag wherein only a Read Cache or Read Array is then performed.

With reference specifically now to FIG. 5, a further representative partial state diagram for a particular implementation of the present invention under the condition of a Read, No Refresh and No Clear Tag operation 500 is shown wherein only a Read Cache or Read Array is then performed. At decision step 502, if a CFA Hit does not occur, then at decision step 504 a DWR Hit is evaluated. If it is, then at step 506, the cache is read. If not, then the array is read at step 508. If there is not a CFA Hit at step 502, then at decision step 510 an evaluation is made as to whether a DRR Hit has occurred. If yes, then the array is read at step 508. Otherwise, the cache is read at step 506.

Under the condition of a Read, No Refresh and No Clear Tag operation 500, the only operation the memory 200 will perform is a cache 208 "read" or a memory array 202 "read". No other background operation occurs.

Figure 6:
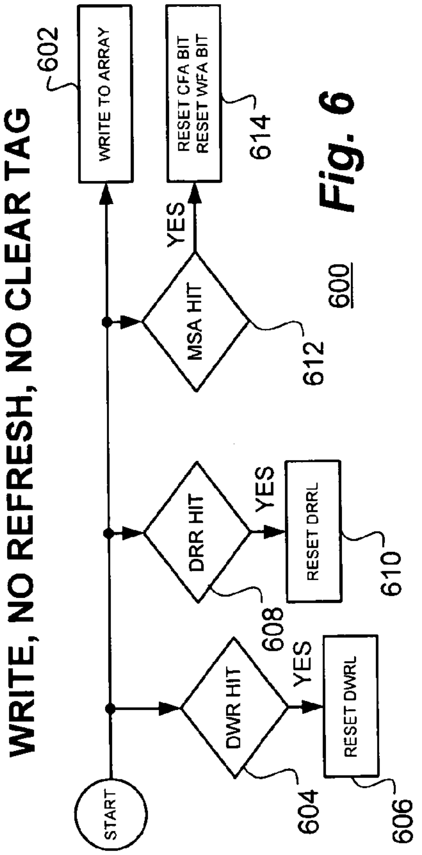
FIG. 6 is a corresponding representative partial state diagram for the particular implementation of the present invention illustrated in FIG. 2A under the condition of a Write, No Refresh and No Clear Tag wherein the array is written.

With reference specifically now to FIG. 6, a corresponding representative partial state diagram for a particular implementation of the present invention is shown under the condition of a Write, No Refresh and No Clear Tag operation 600 wherein the array is written. As illustrated, in the case of a write operation, the array is written at step 602. Decision step 604 determines if a DWR Hit is detected and, if it is, then the DWRL is reset at step 606. Similarly, if a DRR Hit is detected at decision step 608, the DRRL is reset at step 610. Further, if an MSA Hit is detected at decision step 612, the CFA and WFA bits are reset at step 614.

Generally, under the condition of a Write, No Refresh and No Clear Tag operation 600, the memory array 202 will be written. In order to maintain the accuracy of the tags 224W and 224R, the CFA and WFA bits will be reset if the write data is to the mirrored subarray 204. The tag bits at the external address will be reset even if they are not set so that there is no need to know if there is a CFA or WFA hit before deciding what data is to be written to the tag. A DWR 244W or DRR 244R hit causes the data stored in the DWR 244W or DRR 244R to be invalid so the flag indicating valid data (DWRL or DRRL) is reset.

Figure 7:
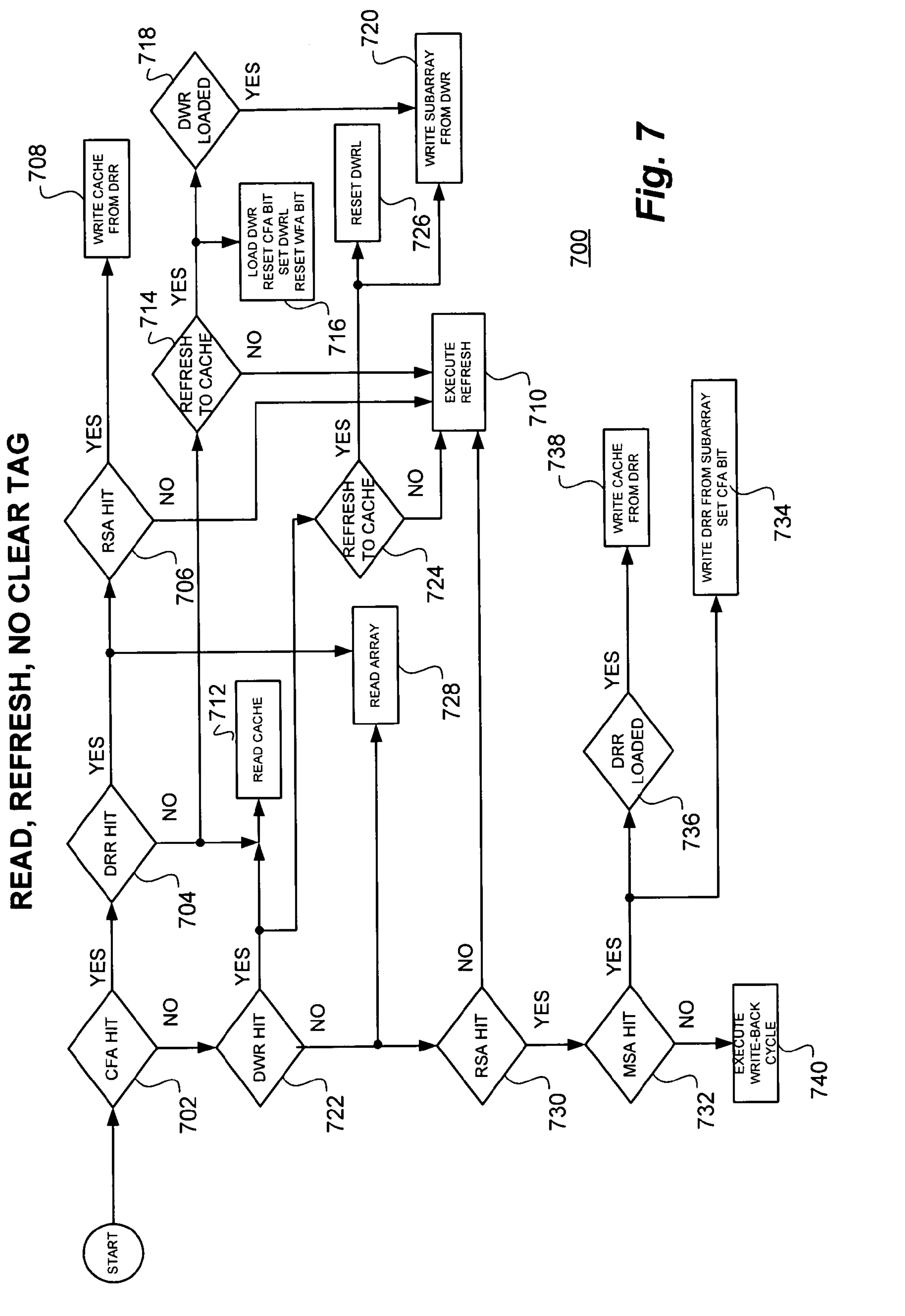
FIG. 7 is a further representative partial state diagram for the particular implementation of the present invention illustrated in FIG. 2A under the condition of a Read, Refresh and No Clear Tag wherein it is possible to Read and Refresh or Read and make progress toward being able to Refresh in a subsequent cycle.

With reference specifically now to FIG. 7, a further representative partial state diagram for a particular implementation of the present invention is shown under the condition of a Read, Refresh and No Clear Tag operation 700 wherein it is possible to Read and Refresh or Read and make progress toward being able to Refresh in a subsequent cycle. The operation 700 begins with a determination at decision step 702 whether there has been a CFA Hit. If so, then a subsequent determination is made at decision step 704 as to whether there has been a DRR Hit. Again, if so, then the array is read at step 728 and a determination is made at decision step 706 as to whether there has been an RSA Hit and, if so, the cache 208 is written from the DRR 244R at step 708.

If, at decision step 706, an RSA Hit is not determined, then a refresh is executed at step 710. If, at decision step 704 a DRR Hit is not determined, then the cache 208 is read at step 712 and, if a refresh to the cache is determined at decision step 714, the DWR is loaded, the CFA bit is reset, the DWRL set and the WFA bit is reset at step 716. Further, at decision step 718, if the DWR is loaded, then the array is written from the DWR at step 720.

At decision step 702, if there is not a CFA Hit, then, at decision step 722, if there is a DWR Hit, the cache is read at step 712, and decision step 724 determines if there is a refresh to the cache 208, and if not, then a refresh is executed at step 710. If, at decision step 724 the refresh is to the cache 208, then the DWRL is reset at step 726 and the subarray is written at step 720. If there is not a DWR Hit at decision step 722, then the array is read at step 728 and a determination is made at decision step 730 as to whether there is an RSA Hit. If not, then a refresh is executed at step 710. If there is an RSA Hit, then, at decision step 732, a determination is made as to whether there is an MSA Hit. If so, then the DRR is written from the subarray and the CFA bit set at step 734. Also, at decision step 736, if the DRR is loaded, then the cache 208 is written from the DRR at step 738. If there is not an MSA Hit at decision step 732, the write-back cycle is executed at step 740.

One example of "making progress" toward being able to refresh in a subsequent cycle is illustrated by step 708. Since a DRR Hit prevents the cache 208 from being read even if a CFA Hit occurs, the DRR was loaded in a previous cycle but the data not yet written to the cache 208. In this case, the data in the cache 208 is not valid so the array 202 must be read. In order to prevent refresh from being stalled indefinitely, if the read is from refresh subarray the data in the DRR 244R is written to the cache 208 and the DRRL (DRR Loaded) flag is reset. If the same address is read in the next cycle, the DRR Hit will be "No", so progress has been made to being able to refresh.

A second example of making progress toward being able to refresh in a subsequent cycle is shown in step 716. To reach this point in the operation 700, decision steps 702 and 714 must both be a "Yes". Since an attempt is being made to refresh the cache 208, reads to data that is valid in the cache 208 can prevent a cache 208 refresh. To guarantee a cache 208 "miss" in a subsequent cycle, the data in the cache is both read to the outside and written to the DWR 244W. In this case, if the DWR 244W is loaded, a write subarray from DWR 244W is required to make room for the new data in the DWR 244W. If the same address is read in the next cycle, the CFA Hit will be "No" (c.f. the ensuing example below) so progress has again been made to being able to refresh.

Another example of making progress toward being able to refresh in a subsequent cycle is shown in the steps 720 and 726 accessed if decision steps 722 and 724 result in a "Yes". In this instance, an attempt is being made to refresh the cache 208 but the cache must be accessed because the data has not yet been transferred from the DWR 244W to the mirrored subarray 204, so the refresh is delayed. The mirrored subarray 204 is not accessed, so the DWR 244W data is written to the mirrored subarray 204 and the DWRL is reset. If the same address is accessed on the next cycle, decision step 722 will result in a "No" and a refresh will be executed.

A fourth example of making progress toward being able to refresh in a subsequent cycle can be seen in step 734. Since the "read" is from the refresh subarray 204 and the mirrored subarray 204 (i.e., the refresh subarray is the mirrored subarray) the data read from the subarray 204 can also be transferred into the DRR 244R. If the DRR 244R contains valid data (i.e. DRRL is set), that data is written to the cache 208. Refresh to the subarray 204 is guaranteed eventually because all data read from the mirrored subarray 204 is transferred to the cache 208. If every word in the subarray 204 is read, (2K words total in the representative embodiment illustrated) the next read to the subarray 204 will result in a CFA Hit. If CFA Hit (decision step 702) is "Yes" and DRR Hit (decision step 704) is "No" the subarray 204 will be refreshed. If decision step 704 is "Yes", it will be cleared as described above.

Yet a fifth example of making progress toward being able to refresh in a subsequent cycle is the "Execute Write-Back Cycle" at step 740. In this case, the refresh and mirrored subarrays 204 are different, but the refresh subarray 204 is the same as the subarray 204 being read. In order for the cache 208 to begin mirroring the refresh subarray 204, the data in the cache 208 corresponding to WFA bits that are set must be written to the mirrored subarray 204. Executing a write-back cycle is a step in that direction. The Write-Back Cycle is described in further detail with respect to FIG. 9.

Figure 8:
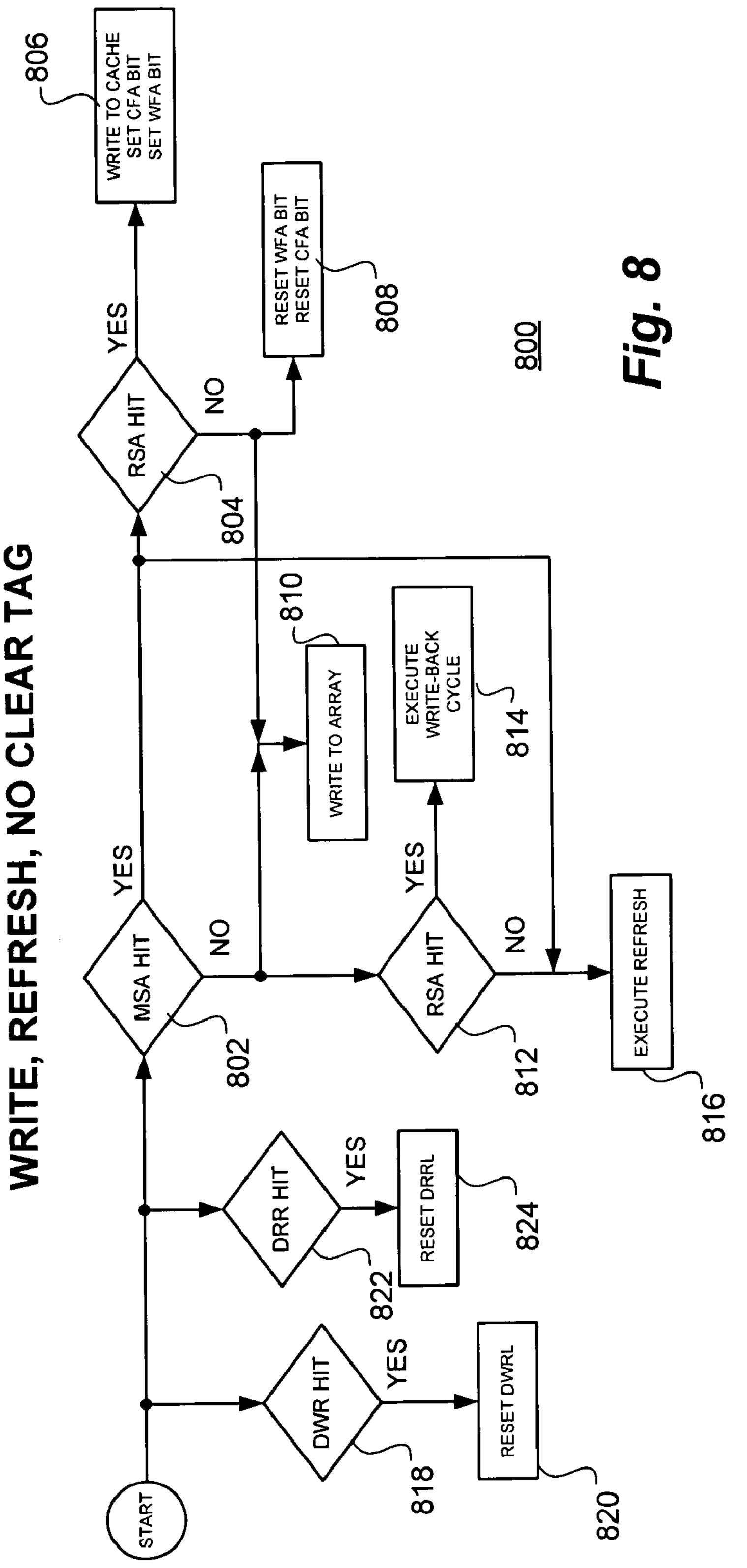
FIG. 8 is a corresponding representative partial state diagram for the particular implementation of the present invention illustrated in FIG. 2A under the condition of a Write, Refresh and No Clear Tag wherein it is possible to Write and Refresh or Write and make progress toward being able to Refresh in a subsequent cycle.

With reference specifically to FIG. 8, a corresponding representative partial state diagram for a particular implementation of the present invention is shown under the condition of a Write, Refresh and No Clear Tag operation 800 wherein it is possible to Write and Refresh or Write and make progress toward being able to Refresh in a subsequent cycle.

At decision step 802, if an MSA Hit is found then a refresh is executed at step 816 and, at decision step 804, a determination is made as to whether there is an RSA Hit at decision step 804. If so, then the cache 208 is written and the CFA and WFA bits are set at step 806. If not, then the CFA and WFA bits are reset at step 808 and a write to the array occurs at step 810. At decision step 802, if there is not an MSA Hit, then the array is also written at step 810 and another determination is made as to whether there is an RSA Hit at decision step 812. If so, then a write-back cycle is executed at step 814 and, if not, then a refresh is executed at step 816.

The operation 800 further includes an assessment as to whether or not there is a DWR Hit at decision step 818 and DRR Hit at decision step 822. In both cases, if affirmative, the DWRL is reset in the former instance at step 820 and the DRRL is reset at step 824 in the latter.

The "Execute Write-Back Cycle" of step 814 is the only example illustrated of making progress for write operations. Refresh is delayed only if the write is to the refresh subarray 204 but not to the mirrored subarray 204. Therefore, the refresh will not be delayed if the mirrored subarray 204 is the refresh subarray 204. As described previously, the mirrored subarray 204 can be changed only after the cache 208 is cleared by write-back cycles. If the refresh is delayed by writes to the refresh subarray 204 for enough cycles to allow the write-back of all cached data to the mirrored subarray 204, the mirrored subarray 204 will be reset to the refresh subarray 204. When the mirrored subarray 204 is the same as the refresh subarray 204, a refresh operation will be executed on any write.

Reset DWRL step 820 and Reset DRRL step 824 are necessary on DWR 244W and DRR 244R hits to prevent stale data in these registers from being written to a subarray 204 or the cache 208. For an MSA Hit at decision step 802, the "Reset WFA Bit, Reset CFA Bit" of step 808 is necessary to maintain the accuracy of the tags 224W, 224R.

With reference specifically now to FIG. 9, a further representative partial state diagram for a particular implementation of the present invention is shown indicative of an Execute Write-Back operation 900 as called in FIGS. 7 and 8. At decision step 902, if the DWRL is set, then the DWR is written to the subarray and the DWRL reset at step 904. Alternatively, if the DWRL is not set, then at decision step 906, a determination is made as to whether WBA<11>=1. If so, then at step 908, the Clear Tag Flag is set, the write-back address is reset and the DRRL is reset. If not, then the write-back counter is incremented and the WFA bit reset at step 910 in addition to an analysis at decision step 912 as to whether there is a WFA Hit. If so, then the cache is written to the DWR and the DWRL set at step 914.

Stated another way, if DWRL is set at decision step 902, the data in the DWR 244W is written to the mirrored subarray 204 and the DWRL is reset. No cache 208 activity occurs in this cycle. On the other hand, if DWRL is not set, and the WBA<11> is not equal to "1" at step 906, the write-back counter 234 is incremented, the WFA bit is reset at step 910, and if the WFA Hit is "Yes" at step 912, then the cache 208 is accessed at the write-back address, the cache data loaded into the DWR 244W and DWRL is set at step 914.

It should be noted that it would be possible to eliminate the DWRL Set decision step 902 and to write the mirrored subarray 204 from the DWRL in the same cycle as new data is read from the cache 208 and written to the DWR 244W. This would allow the possibility of two subarrays 204 and the cache 208 being accessed in a single cycle. The DWRL Set decision step 902 assures that only one subarray 204 and the cache 208, or two subarrays 204, will be activated in a single cycle reducing from three to two the number of DRAM "subarrays" 204 activated simultaneously, and thus, any associated noise.

The significance of the decision step 906 (WBA<11>=1) is that this indicates that all cache 208 locations have been written back to the mirrored subarray 204 and, therefore, the Clear Tag Flag can be set. After the tags 224W, 224R are cleared, the mirrored subarray 204 will be set to be equal to the refresh subarray 204 so it is also necessary to reset the write-back address and DRRL.

Figure 10:
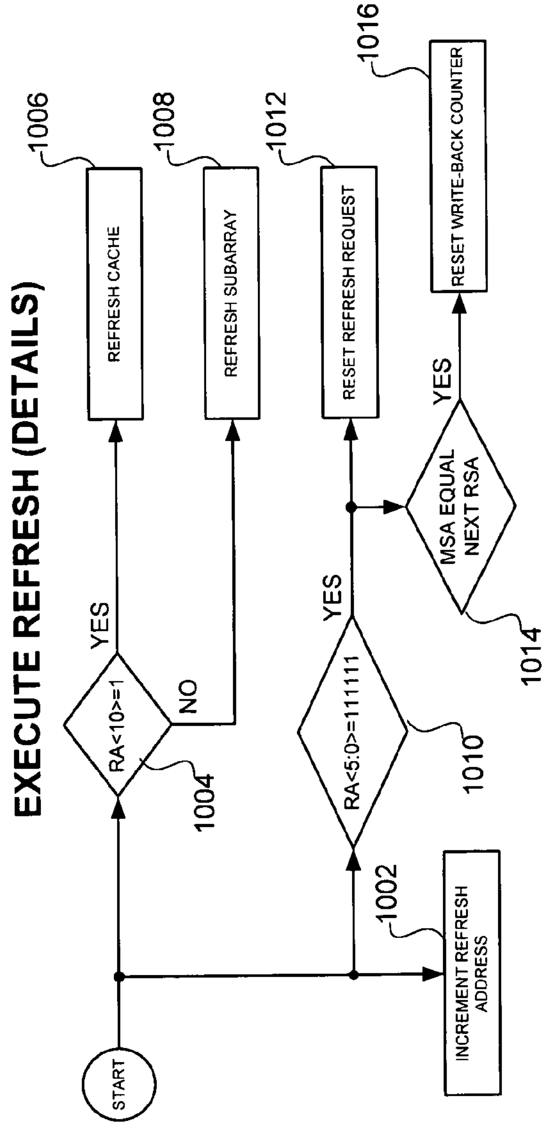
FIG. 10 is a corresponding representative partial state diagram for the particular implementation of the present invention illustrated in FIG. 2A indicative of an Execute Refresh operation as also called in FIGS. 7 and 8.

With reference specifically now to FIG. 10, a corresponding representative partial state diagram for a particular implementation of the present invention is shown indicative of an Execute Refresh operation 1000 as also called in FIGS. 7 and 8. The operation 1000 commences at step 1002 by incrementing the refresh address and determining, at decision step 1004, if RA<10>=1. If so, then the cache 208 is refreshed at step 1006 and, if not then the subarray 204 is refreshed at step 1008.

The operation 1000 also determines, at decision step 1010, if RA<5:0>=111111 and, if so then the refresh request is reset at step 1012 and, at decision step 1014, a determination is made as to whether MSA equals the next RSA and, if so, then the write-back counter 234 is reset at step 1016.

The Execute Refresh operation 1000 is called only when the control logic block 238 assures that a refresh is possible in that cycle, so the refresh address is incremented each time. When RA<10>=1, the cache 208 is refreshed. If RA<10> is not equal to "1", then the subarray 204 addressed by RA<9:6> is refreshed. When the refresh address wordline address (RA<5:0>) is at its maximum value of 111111, the final row of the refresh subarray 204 will be refreshed in this cycle. Therefore, the refresh request is reset since, in the particular implementation of the present invention illustrated, the refresh request timer is set to produce seventeen refresh requests (one for each subarray 204 plus one for the cache 208) in the refresh time required by the memory array 200.

At decision step 1014, if "MSA EQUAL NEXT RSA" (i.e. the mirrored subarray 204 is the subarray that will be the refresh subarray 204 as a result of the refresh address incrementing in this cycle) the write-back counter 234 must also be reset at step 1016. This reset is to assure that all write operations to the cache 208 at addresses lower than the write-back counter 234 value before the reset will be written back to the mirrored subarray 204.

Figure 11A:
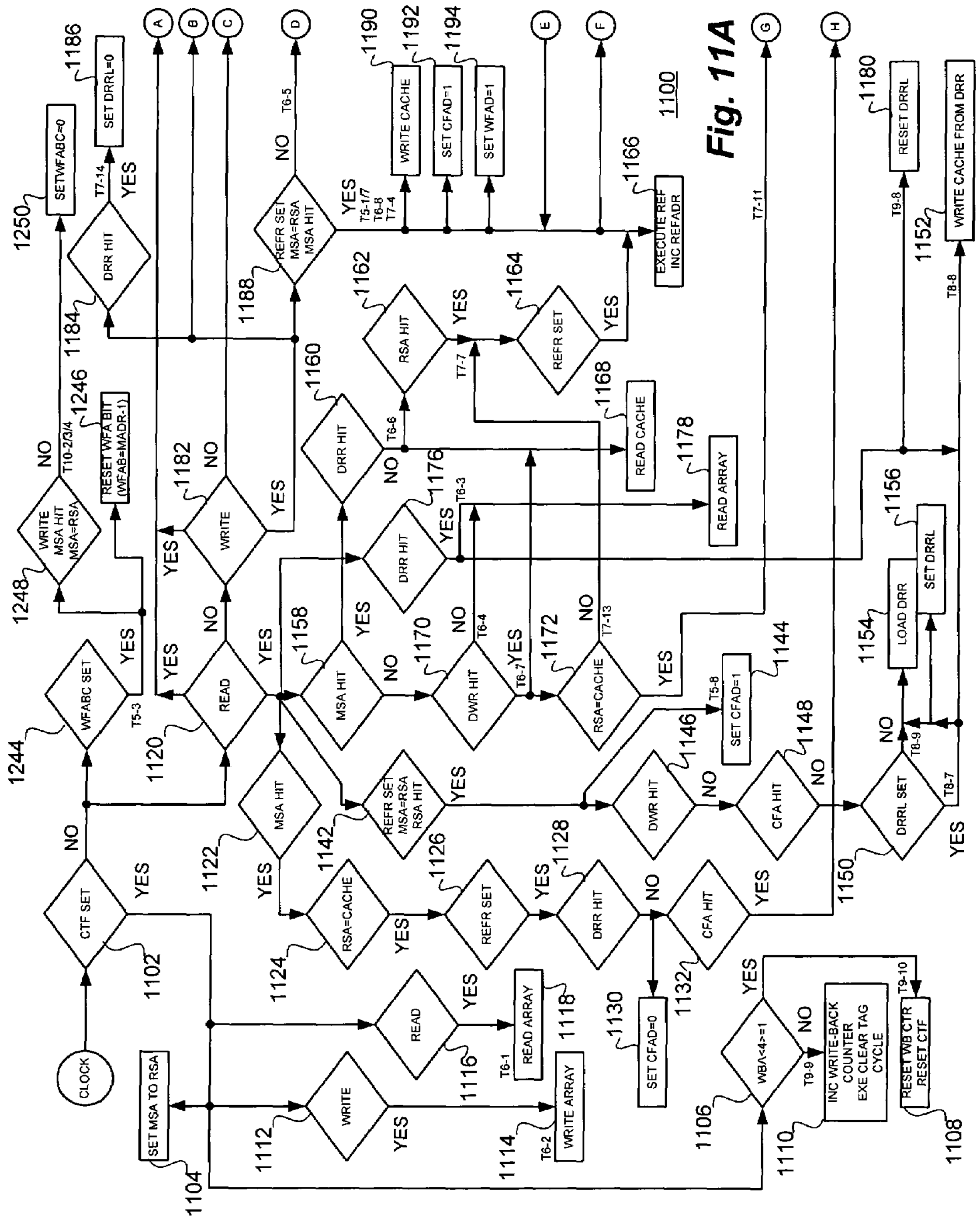
FIGS. 11A and 11B together comprise an exemplary state diagram for the second embodiment of the present invention as illustrated in FIG. 2B and containing notations referring to Tables 3-10 comprising subsequent FIGS. 14-21.
Figure 11B:
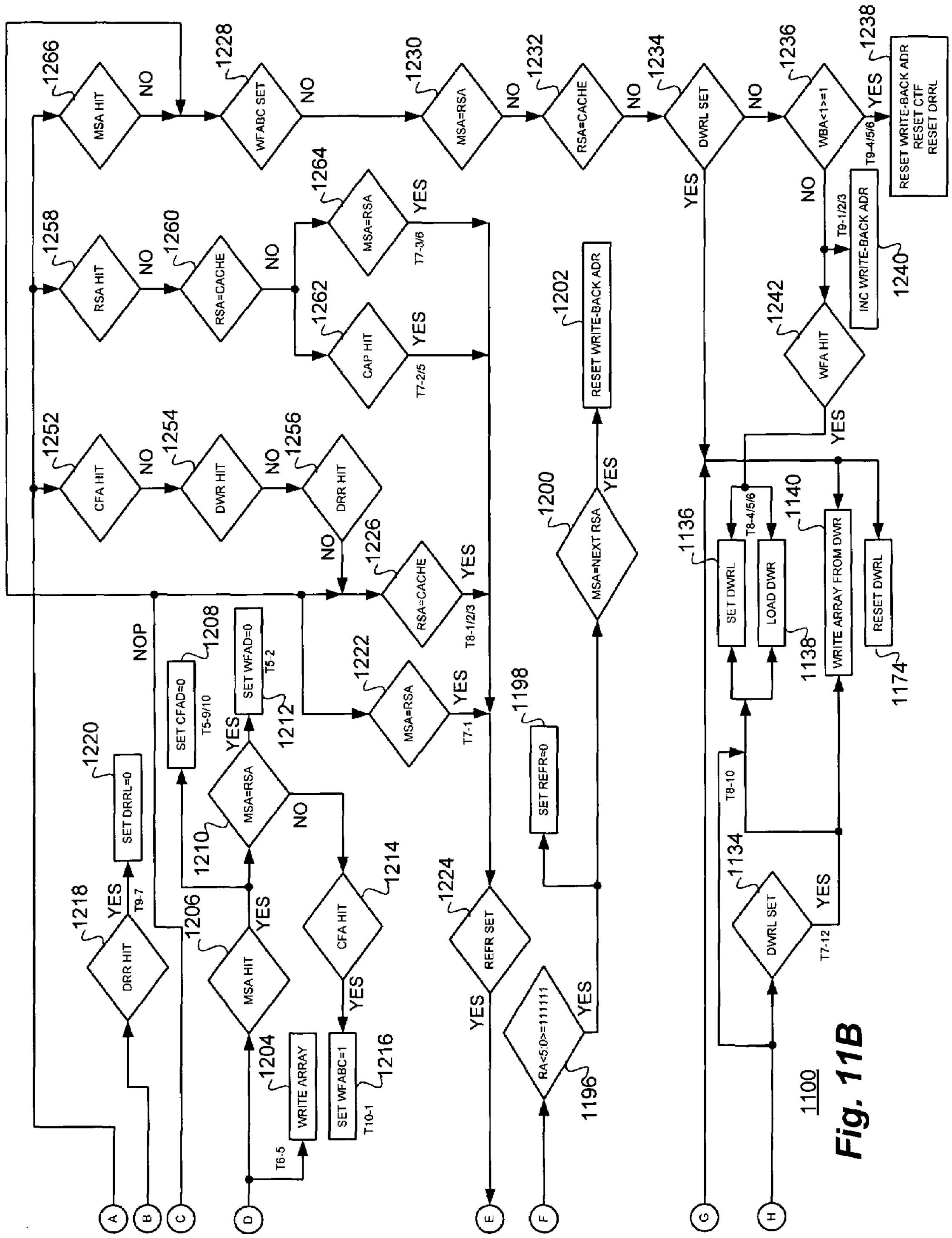

With reference specifically now to FIGS. 11A and 11B, (hereinafter collectively FIG. 11) there is shown another exemplary state diagram indicative of a functional operation 1100 for the particular representative embodiment of the present invention as illustrated in FIG. 2B which further contains selected notations referring to the Tables 3-10 comprising subsequent FIGS. 14-21 respectively. Tables 1 and 2 comprising subsequent FIGS. 12 and 13 respectively relate to the embodiment of the memory 200 illustrated and described with respect to FIG. 2A.

The operation 1100 commences at decision step 1102 to determine if CTF is set. If yes, then at step 1104 MSA is set to RSA and, at decision step 1106, if WBA<4>=1, then the write-back counter 234 is reset along with CTF at step 1108. (See Table 9, line 10). IF WBA<4> is not equal to "1", then, at step 1110 the write-back counter 234 is incremented and a Clear Tag Cycle is executed. (See Table 9, line 9).

Additionally following decision step 1102, if the operation is a "write" at decision step 1112, then the array is written at step 1114. (See Table 6, line 2). Alternatively, if the operation is a "read" at decision step 1116, then the array is read at step 1118. (See Table 6, line 1).

If CTF is not set at decision step 1102, then, at decision step 1120, the operation is tested to determine if it is a "read". If yes, then at decision step 1122, if it is an MSA hit, and at decision step 1124 RSA=CACHE, and at decision step 1126 REFR is set and at decision step 1128, it is not a DRR hit, then CFAD is set to "0" at step 1130. If the operation is a CFA hit at decision step 1132, then the DWRL is set at step 1136 and the DWR 244W is loaded at step 1138. (See Table 8, line 10). Also, at decision step 1134, if DWRL is set, the array is written from the DWR 244W at step 1140 and steps 1136 and 1138 are executed.

At decision step 1120, if the operation is a "read", then also at decision step 1142, if REFR is set, MSA-RSA and there is an RSA hit, then CFAD is set to "1" at step 1144. (See Table 5, line 8). If, at decision step 1146, there is not a DWR hit, and there is not a CFA hit at decision step 1148 and DRRL is set at decision step 1150 (See Table 8, line 7), the cache 208 is written from the DRR 244R at step 1152, the DRR is loaded at step 1154 and the DRRL is set at step 1156. Alternatively, if DRRL is not set, then steps 1154 and 1156 are executed. (See Table 8, line 9).

Also at decision step 1120, if the operation is a "read", then at decision step 1158, if it is an MSA hit and not a DRR hit at decision step 1160 (See Table 6, line 6), then the cache 208 is read at step 1168. If an RSA hit is determined at decision step 1162 (See Table 7, line 7) and REFR is set at decision step 1164, then a refresh is executed and the refresh address incremented at step 1166.

If there is not an MSA hit at decision step 1158, then at decision step 1170, if it is not a DWR hit (See Table 6, line 4), the array is read at step 1178. Alternatively, is there is a DWR hit (See Table 6, line 7) the cache 208 is read at step 1168 and, if RSA=CACHE at decision step 1172, the array is written from the DWR 244W at step 1140 and DWRL is reset at step 1174. If RSA is not equal to CACHE at decision step 1172 (See Table 7, line 13) then the operation 1100 again proceeds to decision step 1164.

Again, at decision step 1120, if the operation is a "read" and a DRR 244R hit at decision step 1176 (See Table 6, line 3), the array is read at step 1178, the cache 208 is written from the DRDR 244R at step 1152 (See Table 8, line 8) and the DRRL is reset at step 1180 (See Table 9, line 8). If the operation is not a "read" at decision step 1120, then at decision step 1182, if it is a "write" and a DRR 244R hit at decision step 1184 (See Table 7, line 14), DRRL is set to "0" at step 1186. If the operation is a "write" at decision step 1182, then, if it is a DRR hit at decision step 1218 (See Table 9, line 7) DRRL is set to "0" at step 1220 while, at decision step 1188 if REFR is set, MSA=RSA and there is an MSA hit (See Table 5, lines 1 and 7, Table 6, line 8 and Table 7 line 4) the cache 208 is written at step 1190 and CFAD and WFAD are each set equal to "1" at steps 1192 and 1194 respectively and a refresh is executed and the refresh address incremented at step 1166. Further, if the decision step 1188 is a "yes", and RA<5:0>=11111 at decision step 1196, then REFR is set to "0" at step 1198 and, if MSA is equal to the next RSA at decision step 1200, then the write-back address is reset at step 1202.

At decision step 1188, if the determination is "no" (See Table 6, line 5), the array is written at step 1204 and, if the operation is an MSA hit at decision step 1206, CFAD is set to 0 at step 1208 See Table 5, lines 9 and 10) and, if MSA=RSA at decision step 1210, then WFAD is also set to "0" at step 1212 (See Table 5, line 2). Alternatively, if MSA is not equal to RSA at decision step 1210 and there is a CFA hit at decision step 1214, then WFABC is set to "1" at step 1216 (See Table 10, line 1).

If CTF is not set at decision step 1102 and WFABC is set at decision step 1244 (See Table 5, line 3) the WFA bit is reset and WFABC is set equal to MADR-1) at step 1246. If, at decision step 1248, the operation is not a write, or there is not an MSA hit or MSA is not equal to RSA (See Table 10, lines 2, 3 and 4) then WFABC is set to "0" at step 1250.

If at either of decision steps 1120 or 1182 the operation 1100 is a "read" or "write", then at decision step 1252, if it is not a CFA hit, and at decision step 1254 not a DWR hit, and at decision step 1256, not a DWR hit and RSA=CACHE at decision step 1226 (See Table 8, lines 1, 2 and 3), and REFR is set at decision step 1224, then a refresh is executed at step 1166 and the refresh address is incremented. In parallel with decision step 1252, if there is not an RSA hit at decision step 1258 and RSA does not equal CACHE at decision step 1260, then if there is a CAP hit at decision step 1262 (See Table 7, lines 2 and 5) or MSA=RSA at decision step 1264 (See Table 7, lines 3 and 6) then the operation proceeds to decision step 1224.

Also in parallel with decision steps 1252 and 1258, if there is not an MSA hit at decision step 1266, and WFABC is not set at decision step 1228 and MSA is not equal to RSA at decision step 1230 and RSA is not equal to CACHE at decision step 1232 and DRWL is set at decision step 1234, the operation 1100 proceeds to steps 1140 and 1174. If, at decision step 1234 DWRL is not set, then, at decision step 1236, if WBA<1>=1 (See Table 9, lines 4, 5 and 6), the write-back address is set and CTF and DRRL are reset at step 1238. Alternatively, if WBA<1> is not equal to "1" at decision step 1236, then the write-back address is incremented (See Table 9, lines 1, 2 and 3) at step 1240 and, if there is a WFA hit at decision step 1242, then the DWRL is set at step 1136 and the DWR loaded at step 1138 (See Table 8, lines 4, 5 and 6). Also, at decision step 1234, if DWRL is set, then the operation 1100 proceeds to steps 1140 and 1174.

At decision step 1182, if the operation is not a "write", (and not a "read" at decision step 1120), then it is a "no operation" (NOP) and the operation 1100 proceeds to decision step 1228 as well as to decision step 1226 and 1222 (MSA=RSA) where, if either is a "yes" (See Table 7, line 1 with respect to step 1222) then the operation 1100 proceeds to decision step 1224.

In the specific implementation of the subject matter of the aforementioned patent application that is exemplified in FIG. 1, write-back cycles are performed only when the following is true: The Refresh Request is asserted; the read or write operation is to the refresh subarray and the refresh subarray is not the mirrored subarray. The embodiment of the present invention illustrated in FIG. 2A herein attempts to perform write-back cycles for the same conditions as that of FIG. 1 while the embodiment of FIG. 2B attempts write-back operations at every opportunity.

A possible advantage of the implementation of FIG. 2A over that of FIG. 2B is that the design tends to minimize the number of write-back cycles, thus minimizing power consumption. On the other hand, the representative implementation of the present invention disclosed herein makes an attempt to maintain the mirrored subarray the same as the refresh subarray. Data is written to the cache only when the mirrored subarray and the refresh subarray are the same so keeping them the same serves to minimize how long the refresh operation could be delayed. However, in the worst case pattern of accesses, it may not possible to achieve the goal of keeping the mirrored subarray and the refresh subarray the same. In the worst case pattern of accesses, there is no difference in delay before refresh can be accommodated for the embodiment of FIG. 2A and the implementation of FIG. 2B.

In addition to all evaluations, functions and flags of the implementation of FIGS. 3-10, FIG. 11 contains the WFABC SET decision. The WFABC (WFA Bit Clear) flag is set in a write cycle with a CFA hit and a refresh subarray miss. During this cycle, data is written to the mirrored subarray and the CFA bit is reset. During this cycle the write-back address is asserted on the WFA bus in anticipation that a write-back cycle may be performed. Therefore, the WFA bit addressed by the external address is not addressed and therefore cannot be reset in this cycle. WFABC is set so that the WFA bit will be cleared in the next cycle using the external address of the cycle during which WFABC was set.

FIG. 11 also contains notations (by Table and Line number) that refer to the Tables 3 to 10 of FIGS. 12 through 21 respectively.

In this regard, Table 1 comprises a list of the addresses that are to be multiplexed onto each of the address buses for which multiplexing is required for FIGS. 3-10. The condition of Read, Refresh, No Clear Tag is the same as that of FIG. 7. The conditions of Table 1 assure that the correct address is multiplexed onto the address buses for any action required by FIG. 7. Note that no WFA hit or CFA hit information is required to make the multiplexing decisions. This allows the address multiplexing and the tag accesses to be performed in parallel.

As for Table 2, it comprises a list of the address that must be multiplexed onto each of the address buses for which multiplexing is required. The condition of Write, Refresh, No Clear Tag is the same as that of FIG. 8. The conditions of Table 2 assure that the correct address is multiplexed onto the address buses for any action required by FIG. 8. Note that no WFA hit or CFA hit information is required to make the multiplexing decisions. This allows the address multiplexing and the tag accesses to be performed in parallel.

Address information for the current cycle is required in Tables 1 and 2 of FIGS. 12 and 13 respectively to determine the addresses to be multiplexed onto the WFAB and CFAB for the FIG. 2A implementation of a memory 200. The address information is available before the rising edge of the clock by the setup time for the addresses. By contrast, the information required in Table 4 of FIG. 15 to determine the address multiplexing for the FIG. 2B implementation of a memory 200 is associated only with the previous cycle. If the setup time is adequate to allow the address multiplexing onto the WFAB and CFAB buses to be accomplished during the setup time, there is no access time penalty for the implementations of a memory 200 as illustrated in FIG. 2A relative to that of the embodiment of FIG. 2B.

The multiplexing required for other operating conditions in FIGS. 3-6 and FIGS. 9-10 is readily apparent. Tables 3 to 10 describe in detail the signals that are generated based on FIG. 11 logic.

While there have been described above the principles of the present invention in conjunction with specific implementations of a high-speed SCRAM in accordance with the present invention, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein.

Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

What is claimed is:

1. An integrated circuit device comprising:

a dynamic random access memory array comprising a plurality of memory subarrays;

a cache for mirroring any one of said plurality of memory subarrays;

a mirrored subarray pointer for indicating which one of said plurality of memory subarrays is currently being mirrored by said cache;

a tag for indicating which data in said cache is valid; and means for storing a previous external address means for indication of whether there is an incorrect bit set in said tag that must be corrected in a subsequent cycle.

2. The integrated circuit device of claim 1 wherein said means for storing a previous external address comprises a register.

3. The integrated circuit device of claim 1 further comprising:

a data read register for maintaining data that has been read from said memory array; and a data write register for maintaining data that has been read from said cache.

4. The integrated circuit device of claim 3 wherein said data maintained in said data read register is subsequently to be written into said cache.

5. The integrated circuit device of claim 4 wherein said data maintained in said data read register is written to said cache in a subsequent device clock cycle.

6. The integrated circuit device of claim 3 wherein said data maintained in said data write register is subsequently to be written into said memory array.

7. The integrated circuit device of claim 6 wherein said data maintained in said data write register is written to said memory array in a subsequent device clock cycle.

8. The integrated circuit device of claim 1 wherein said cache comprises dynamic random access memory cells.

9. The integrated circuit device of claim 8 wherein said cache comprises a number of memory cells equal to that of each of said plurality of memory subarrays.

10. The integrated circuit device of claim 8 further comprising:

a refresh counter coupled to said memory array and said cache.

11. The integrated circuit device of claim 10 wherein said refresh counter is coupled to said memory array and said cache through respective internal array and cache address busses.

12. The integrated circuit device of claim 1 further comprising:

an address control block for receiving addresses supplied externally to said integrated circuit device.

13. The integrated circuit device of claim 12 wherein said address control block is coupled to said memory array and said cache through an external address bus.

14. The integrated circuit device of claim 13 further comprising:

an internal array address bus and an internal cache address bus separate from said external address bus.

15. The integrated circuit device of claim 14 further comprising:

a refresh counter coupled to said internal array address bus and said internal cache address bus.

16. The integrated circuit device of claim 14 further comprising:

a write-back counter coupled to said internal array address bus and said internal cache address bus.

17. The integrated circuit device of claim 14 further comprising:

a write tag block and a read tag block for tracking valid data in said cache.

18. The integrated circuit device of claim 17 further comprising:

a write tag address bus coupled to said write tag block; and a read tag address bus coupled to said read tag block, said write and read tag address busses being coupled to said external address bus.

19. The integrated circuit device of claim 13 wherein said means for storing a previous external address comprises a previous external address register coupled to said external address bus for storing an external address for at least one cycle.

* * * * *